US012813312B2

(12) United States Patent
Mohan et al.

(10) Patent No.: US 12,813,312 B2
(45) Date of Patent: Nov. 24, 2026

(54) LASER ENHANCED WIRE BONDING FOR SEMICONDUCTOR DEVICE PACKAGES

(71) Applicant: Texas Instruments Incorporated, Dallas, TX (US)

(72) Inventors: Kashyap Mohan, Irving, TX (US); Daiki Komatsu, Hiji (JP); Amin Ahmad Sijelmassi, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 387 days.

(21) Appl. No.: 18/498,921

(22) Filed: Oct. 31, 2023

(65) Prior Publication Data

US 2025/0140739 A1 May 1, 2025

(51) Int. Cl.
*H10W 72/00* (2026.01)
*H10W 72/50* (2026.01)

(52) U.S. Cl.
CPC .. *H10W 72/07535* (2026.01); *H10W 72/0115* (2026.01); *H10W 72/075* (2026.01); *H10W 72/50* (2026.01); *H10W 72/01551* (2026.01); *H10W 72/07511* (2026.01); *H10W 72/07521* (2026.01); *H10W 72/5525* (2026.01)

(58) Field of Classification Search
CPC ........... H10W 72/075; H10W 72/0115; H10W 72/50; H10W 72/01551; H10W 72/07511; H10W 72/07521; H10W 72/07535; H10W 72/5525; H10W 72/0116; H10W 72/0711
See application file for complete search history.

(56) References Cited

U.S. PATENT DOCUMENTS 5,037,023 A * 8/1991 Akiyama ............. B23K 20/007 228/180.5
5,452,841 A * 9/1995 Sibata .................... B23K 26/20 228/180.5
7,476,597 B2 * 1/2009 Subido ................. B23K 20/007 438/799
2005/0150932 A1 * 7/2005 Hosseini .............. B23K 20/004 228/180.5
2011/0017806 A1 * 1/2011 Cayabyab ............ B23K 20/007 228/110.1
2011/0260307 A1 * 10/2011 Schneegans ........ H10W 40/255 257/676

(Continued)

OTHER PUBLICATIONS

Chaudhry et. al., "TI's Journey to High-vol. Copper Wire Bonding Production", White Paper, Texas Instruments Incorporated, Dallas Texas USA, Oct. 2014, retrieved from the world wide web at uniform resource locator (url) address: https://www.ti.com/lit/wp/sszy003/sszy003.pdf?ts=1698762238095&ref_url=https%253A%252F%252Fwww.google.com%252F on Oct. 31, 2023.

(Continued)

*Primary Examiner* — Eduardo A Rodela
(74) *Attorney, Agent, or Firm* — Dawn Jos; Charles F. Koch

(57) ABSTRACT

An example apparatus includes: a wire bond tool including a bond wire capillary having a central opening configured for receiving a bond wire in the central opening; a first laser path formed in the capillary configured to focus a first laser beam on the end of the bond wire to form a free air ball; and a second laser path formed in the capillary configured to focus a second laser beam on a bonding location beneath the capillary.

15 Claims, 19 Drawing Sheets

(56) References Cited

U.S. PATENT DOCUMENTS

| | | | | |
|---|---|---|---|---|
| 2013/0056448 | A1* | 3/2013 | Kim | B23K 26/037 219/121.63 |
| 2021/0111146 | A1* | 4/2021 | Camargo | B23K 20/10 |
| 2024/0128228 | A1* | 4/2024 | Rabilas, Jr. | H10W 72/50 |

OTHER PUBLICATIONS

Unger et al., "Cell Interconnections in Battery Packs using Laser Assisted Ultrasonic Wire Bonding", IMAPS 2020-53rd International Symp. on Microelectronics, Oct. 5-8, 2020, retrieved from the world wide web at uniform resource locator (url) address: https://imapsource.org/article/56419 on Oct. 31, 2023.

* cited by examiner

LASER ENHANCED WIRE BONDING FOR SEMICONDUCTOR DEVICE PACKAGES

TECHNICAL FIELD

This disclosure relates generally to semiconductor device packages, and more particularly to semiconductor device packages including a semiconductor die coupled to leads of a package substrate using bond wires and a wire bonding process.

BACKGROUND

Semiconductor device packages are widely used for a variety of applications. In a wire bonded semiconductor device package, a semiconductor die or multiple semiconductor dies are mounted to a package substrate. The package substrate can be a leadframe with conductive leads spaced from a die mounting pad. The semiconductor dies are attached to the die mounting pad with bond pads on the semiconductor die facing away from the die mounting pad. To electrically connect the bond pads on the semiconductor die to the conductive leads, a wire bonding process is often used. In a wire bonding process, a capillary is positioned over the devices. The capillary has a spool of bond wire connected to supply the bond wire through a small central opening in the capillary. The capillary is of a hard material such as a ceramic or other dielectric.

A flame or electric arc can be used to melt the exposed end of the bond wire extending a short distance through the capillary. A ball of molten material, referred to as a "free air ball", is formed at the end of the bond wire protruding from the capillary. The capillary and the package substrate, which includes the semiconductor die mounted to it, are moved with respect to one another. In an example wire bonder tool, the capillary may move in the "Z" direction, that is vertically as the elements are usually oriented, while either the capillary, which may be mounted on an arm or support, or the package substrate, such as a unit leadframe, or an array or grid of leadframes, is moved in the "X-Y" direction, that is moved in two directions in a horizontal plane, as the elements are usually oriented.

To form a wire bond, a capillary carrying the bond wire forces the free air ball of molten bond wire material onto a bond pad of the semiconductor die. The bond pad can be of copper, aluminum, gold, or alloys of these. Recently copper bond pads are more frequently used as copper conductors are commonly formed in the semiconductor damascene conductor processes. Aluminum bond pads are also used. In some example processes, the bond pad can include thin plated layers used to enhance bondability by reducing corrosion and oxidation of the bond pad. In an example semiconductor fabrication process, gold, nickel, or palladium layers, or combinations of these, can be used.

Thermosonic wire bonding is frequently used. In thermosonic wire bonding, ultrasonic energy is applied to the capillary during the ball bonding process from an ultrasonic generator (USG) attached to the capillary. The ultrasonic energy vibrates the capillary while the molten ball is mechanically pressed onto the bond pad, contemporaneously the package substrate and semiconductor die are heated (for example, using a heating block the package substrate rests on) so that the wire bonding process uses mechanical pressure from the capillary, ultrasonic energy applied to the capillary, and heat to form the bond. The ultrasonic vibration is used in part to ensure that any oxidation or corrosion formed on the surface of the bond pad is "broken through" and to ensure a reliable mechanical and electrical bond is formed. In addition, the package substrate, in an example a leadframe, and the semiconductor die are heated during bonding, which further increases the likelihood a reliable bond is formed. In some example processes, for example where copper or plated copper bond wires are used, the process is performed in an anoxic atmosphere by use of an inert gas such as nitrogen placed around the elements. This oxygen free atmosphere retards or reduces oxidation of the copper wire and copper conductors. While use of the increased temperatures increases the bond reliability, the increased temperature can also accelerate oxidation of copper in air, the inert atmosphere addresses these problems by forming the bond in an environment without oxygen.

After the ball bond is formed, the capillary is moved vertically and laterally away from the bond pad, while the bond wire extends through the opening in the capillary. The capillary may be moved, or the package substrate and the capillary may be moved relative to one another. As the capillary is moved to a location over a lead or conductor where a second bond will be formed, the bond wire loops from the end of the capillary and can be shaped in arcs or curves over the elements. The capillary then mechanically forces a portion of the extended bond wire onto a conductor, such as a leadframe lead, and makes a stitch bond by mechanical pressure, ultrasonic energy and thermal energy being applied. The capillary then leaves the stitch bond and a clamp is used to hold the bond wire as the capillary moves so that the bond wire is broken at a short distance from the stitch bond, forming a small tail extending from the stitch bond. The exposed end of the bond wire is then again melted to form another free air ball, and the process is repeated for each of the wire bond connections needed to couple the bond pads of a semiconductor die to the leads of the package substrate. Wire bonding can be automated and the wire bonds needed for a semiconductor die can be performed rapidly, such as in a few seconds or less for each semiconductor die, depending on the number of bond wires needed. Wire bonders can use machine vision and automated visual inspection to rapidly make the wire bonds. An operator can assist, or the process can be fully automated. Many thousands of wire bonds can be performed in a few seconds.

Once the wire bonds are formed, mold compound, such as epoxy mold compound (EMC), a thermoset material, can be used to cover the semiconductor die and a portion of the package substrate including the bond wires and a portion of the leads, to from a semiconductor device package. During the molding process, a portion of the leads is left exposed from the mold compound to form terminals. In one example package type, a dual in line (DIP) package, the leads form device terminals that exit the mold compound on a side portion, usually at or near the middle of the sides of the molded semiconductor device package. The DIP terminals are shaped to extend at an angle to a bottom surface of the package, such as a normal angle, and form pins for insertion into sockets, for example, or for through hole mounting by insertion into a plated hole in a printed circuit board or module. The DIP leads can be formed to have feet for surface mounting using solder. In another popular package type, a quad flat no lead (QFN) package, the leads are exposed from the mold compound on a board side surface of the semiconductor device package, but do not extend away from the molded package body, to save board area when compared to the terminals of a DIP package, for example. QFN packages are increasingly used to preserve board area.

The use of copper bond wire is increasing. Copper bond wire has low resistivity and is lower in cost than gold and silver, which can also be used. Copper wire bonding has some challenges in forming reliable bonds due to the oxidation of copper. Copper bond wire is harder than gold bond wire. The mechanical pressure of the copper wire and ultrasonic vibration applied onto a bond pad can damage the bond pad, causing reliability issues. Copper bond wire and copper bond pads can oxidize, so plating of other metals, such as gold, nickel, and palladium are often used to enhance bondability. Copper bond wire may be plated with palladium (palladium coated copper or "PCC") to reduce oxidation; however, this approach increases costs. The use of ultrasonic energy in the copper wire bonding process can also damage the plated materials used as thin electroplated layers on the copper bond pads, causing bonding defects and reducing reliability of the wire bonds. The use of ultrasonic energy also requires an ultrasonic generator as part of the wire bonding tool. The use of the increased temperature applied to the leadframe leads also heats the semiconductor dies, which can create thermal stress on sensitive devices formed within the semiconductor die, for example certain sensors and temperature sensitive devices with low thermal processing budgets can be negatively impacted by the wire bonder heating process. Dies can warp due to the thermal cycle of the wire bonder. A reliable and economical wire bonding process, and one that is effective and reliable for copper wire bonding, is needed.

SUMMARY

An example described method includes: using a first laser, forming a free air ball of molten material on an end of a bond wire; using a second laser, forming a molten area on a bond pad of semiconductor die at a bonding location; forming a ball bond between the free air ball and the molten area of the bond pad; moving the capillary away from the ball bond, while allowing the bond wire to extend; moving the capillary above a stitch bond location on a lead; using the second laser, forming a molten area in a heat affected zone on the lead at a stitch bond location; and using the capillary, contacting the molten area on the lead with the bond wire and while using the first laser to heat the bond wire, forming a stitch bond between the bond wire and the molten area on the lead.

In an additional described example, an apparatus includes: a leadframe having a die pad and leads spaced from the die pad; a semiconductor die mounted to the die pad, and having bond pads facing away from the leadframe; and a wire bond electrically coupling the bond pad to a lead. The wire bond further includes a ball bond formed on the bond pad, the ball bond having a metal to metal bond between the ball and the bond pad, the bond pad having a heat affected zone beneath the ball bond of less than 100 microns in diameter; a bond wire extending from the ball bond; a stitch bond formed on the lead between the lead and the bond wire, the stitch bond being a metal to metal bond; and mold compound covering the semiconductor die, the wire bond, and a portion of the leads of the leadframe to form a semiconductor device package.

In another example, an apparatus includes: a wire bond tool including a bond wire capillary having a central opening configured for receiving a bond wire in the central opening; a first laser path formed in the capillary configured to focus a first laser on the end of the bond wire to form a free air ball; and a second laser path formed in the capillary configured to focus a second laser on a bonding location beneath the capillary.

DETAILED DESCRIPTION

Figure 1A:
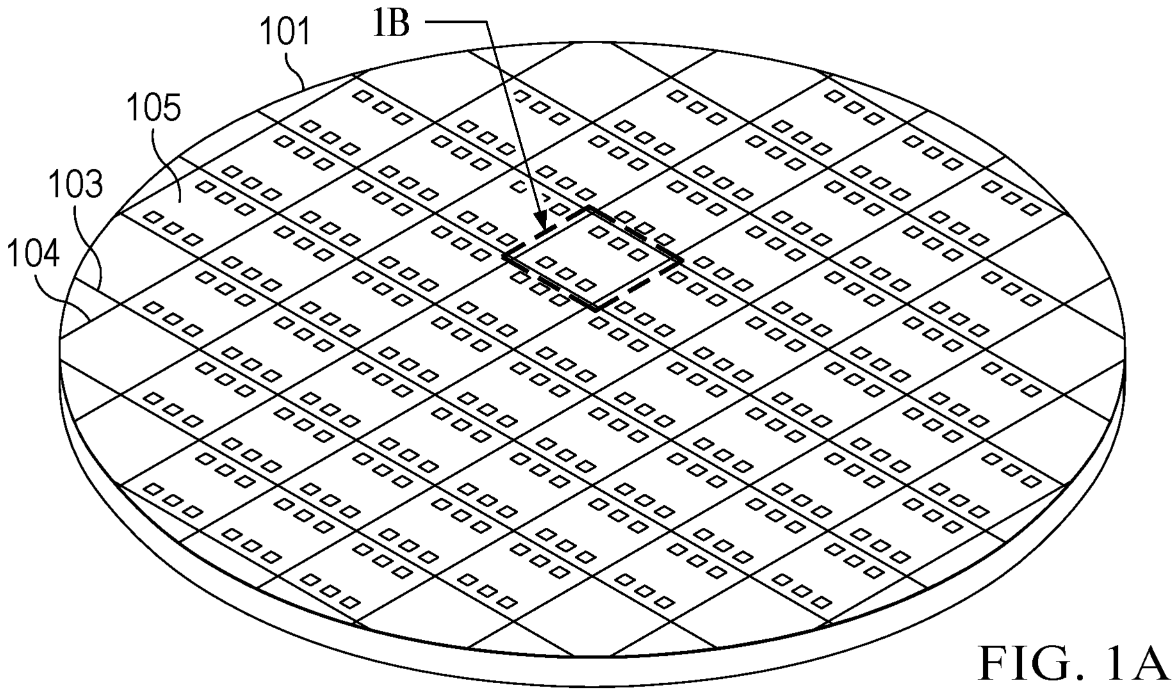
FIGS. 1A-1B illustrate, in a projection view and a close-up projection view, respectively, semiconductor dies on a semiconductor wafer, and an individual semiconductor die from the semiconductor wafer for use with the arrangements.

Corresponding numerals and symbols in the different figures generally refer to corresponding parts, unless otherwise indicated. The figures are not necessarily drawn to scale.

Elements are described herein as "coupled." The term "coupled" includes elements that are directly connected and elements that are indirectly connected, and elements that are electrically connected even with intervening elements, conductors, or wires are coupled.

The term "semiconductor die" is used herein. The semiconductor die can include passive devices such as resistors, inductors, filters, sensors, or active devices such as transistors. The semiconductor die can be an integrated circuit with hundreds or thousands of transistors coupled to form a functional circuit, for example a microprocessor or memory device. The semiconductor die can include elements such as Hall elements for sensing magnetic fields.

The term "semiconductor device package" is used herein. A semiconductor device package has at least one semiconductor die electrically coupled to terminals, and has a package body that protects and covers the semiconductor die. The semiconductor device package can include additional elements. Passive components such as sensors, antennas, capacitors, coils, inductors, and resistors can be included. In some example arrangements, multiple semiconductor dies are packaged together. Circuitry that combines functions such as a sensor, an amplifier semiconductor die and a logic semiconductor die (such as a controller die or digital filter) can be packaged together to form a single semiconductor device package. The semiconductor die is/are mounted to a package substrate that carries conductive leads. A portion of the conductive leads form external terminals or pins for the packaged device. In wire bonded semiconductor device packages used in the arrangements, wire bonds couple conductive leads attached to a package substrate to bond pads on the semiconductor die. The semiconductor device package can have a package body formed by a thermoset epoxy resin in a molding process, or by the use of epoxy, plastics, or resins that are liquid at room temperature and are subsequently cured. The package body may provide a hermetic package for the packaged device. The package body may be formed in a mold using an encapsulation process, however, a portion of the leads of the package substrate are not covered during encapsulation, these exposed lead portions provide the external terminals or pins for the semiconductor device package.

The term "package substrate" is used herein. A package substrate is a substrate arranged to receive a semiconductor die and to support the semiconductor die in a completed semiconductor device package. Package substrates can include conductive leadframes, which can be formed from copper, aluminum, stainless steel, steel and alloys such as Alloy 42 and copper alloys. Conductive leads are positioned for coupling to bond pads on the semiconductor die. The package substrates can be direct bonded copper (DBC) substrates, or ceramic substrates with copper traces. Conductive leads are mounted to the package substrates and extend from them. The electrical connections from the bond pads of the semiconductor dies to the leads are formed using wire bonds or wedge bonds. The leadframes can be provided in strips, grids or arrays. The conductive leadframes can be provided as a panel or grid with strips or arrays of unit leadframe portions in rows and columns. Semiconductor dies can be placed on respective ones of the unit leadframe portions within the strips or arrays for parallel processing to increase throughput. The leadframe leads may have plated portions in areas designated for wire bond connections to the semiconductor die, for example silver plating can be used.

In packaging semiconductor devices, mold compound may be used to partially cover a package substrate, to cover components, to cover a semiconductor die or multiple semiconductor dies, and to cover the wire bond or other electrical connections from the semiconductor die or dies to the package substrate. This molding process can be referred to as "encapsulation", although some portions of the package substrates are not covered in the mold compound during encapsulation. For example, in the arrangements, portions of the package are leads that are left exposed from the mold compound to form terminals or pins. Encapsulation is often a compressive molding process, where a thermoset mold compound such as resin epoxy can be used. Mold compound used in electronic packaging is sometimes referred to as "epoxy mold compound" or "EMC." In an example process, a room temperature solid or powder EMC can be heated to a liquid state, and then transfer molding can be performed by pressing the liquid mold compound into a mold cavity through runners or channels. Unit molds shaped to surround an individual device may be used, or block molding may be used to mold several semiconductor devices in a single block shape. The molding process forms multiple semiconductor device packages simultaneously for several semiconductor devices. The devices to be molded can be provided in an array or matrix of several, hundreds or even thousands of devices in rows and columns on a leadframe strip. The semiconductor devices and leadframes are then molded at the same time to increase throughput.

The term "scribe lane" is used herein. A scribe lane is a portion of semiconductor wafer between semiconductor dies. Sometimes the term "scribe street" is used. Once semiconductor processing is completed and the semiconductor devices are complete, the semiconductor devices are separated into individual semiconductor dies by severing the semiconductor wafer along the scribe lanes. The separated dies can then be removed and handled individually for further processing. This process of removing dies from a wafer is referred to as "singulation" or sometimes referred to as "dicing." Scribe lanes are arranged on four sides of semiconductor dies and when the dies are singulated from one another, rectangular semiconductor dies are formed.

The term "saw street" is used herein. A saw street is an area defined between molded electronic devices used to allow a saw, such as a mechanical blade, laser or other cutting tool to pass between the molded electronic devices to separate the devices from one another. This process is another form of singulation. When the molded electronic devices are provided in a strip with one device adjacent another device along the strip, the saw streets are parallel and normal to the length of the strip. When the molded electronic devices are provided in an array of devices in rows and columns, the saw streets include two groups of parallel saw streets, the two groups are normal to each other and the saw will traverse the molded electronic devices in two different directions to cut apart the packaged electronic devices from one another in the array.

In the arrangements, a wire bonding process uses laser energy. A wire bonder capillary of an example arrangement can include one or more laser paths as part of, or positioned adjacent to, the capillary. In an example arrangement, a first laser beam is focused to form a free air ball on the end of a bond wire extending from the capillary. A second laser beam is focused on a bonding location, such as a bond pad surface. In performing a ball bond, the first laser is used to form a molten bond on the end of the bond wire, instead of the conventional electric flame off (EFO) arc method or instead of a torch, and contemporaneously, the second laser beam is focused on the bond pad surface. When copper bond wire is used with copper bond pads, a copper-to-copper ball bond is formed by forming a small molten copper surface on the bond pad and forcing the molten end of the bond wire into it. Because the wire bonding process forms a small molten area on the bond pad, problems of corrosion and oxidation faced by prior thermosonic wire bonders are solved without the need for ultrasonic energy, and without the need to heat the entire semiconductor die. Local heating of the bond pad at the bonding location using the lasers provides a reliable copper to copper bond (when copper bond wire is used with a copper bond pad), and by reducing or eliminating the vibration used without the arrangements, damage to the copper bond pad is eliminated. Plated copper bond wire, and gold, silver or aluminum bond wire with copper or aluminum bond pads can also be used with the arrangements.

After the ball bond is formed, the lasers in the capillary can also be used to form a stitch bond on a lead of the package substrate. The second laser can be focused on a bonding location on the conductive lead where the stitch bond is to be formed, and a small molten area is created. A stitch bond to the bond wire is then formed on the copper lead at the bond location. Because the conductive lead has a molten surface at the location where the stitch bond is to form, again a reliable metal to metal bond, for example a copper-to-copper bond, is formed without the need for the ultrasonic energy used in conventional thermosonic wire bonders. The laser can be an ultraviolet laser, for example a 380-nanometer laser, or a blue laser, such as a 445-nanometer laser, for example, these frequencies of laser energy are absorbed well by both copper and gold conductors, and reliable copper to copper welds have been demonstrated.

Other frequencies of lasers can be used. Commercially available blue lasers can be used with the arrangements, at reasonable cost.

Use of the arrangements enables reliable and cost-effective copper to copper wire bonds using copper bond wire and copper bond pads. Alternatives include gold bond wire and gold-to-gold wire bonds. The need for cladding on the copper bond wires is reduced or eliminated, lowering costs. The need for an ultrasonic generator for the wire bonder is eliminated as well, again lowering costs for the equipment. Laser sources useful with the arrangements are commercially available and have been proven reliable.

Use of the arrangements to perform wire bonding on a semiconductor die and package substrate creates a small heat affected zone (HAZ) where the ball bonds and stitch bonds are to be made, and this small HAZ enables rapid cooling after the bonding operation. Rapid cooling of the bonds subsequently increases wire bonding speed, increasing throughput and yield, further lowering device costs. In addition, in an example process, the use of the arrangements can eliminate the need to perform the bonding with the package substrates and semiconductor devices positioned on a heating block, reducing costs for the wire bonder tool and reducing thermal stress on the semiconductor dies.

Figure 1B:
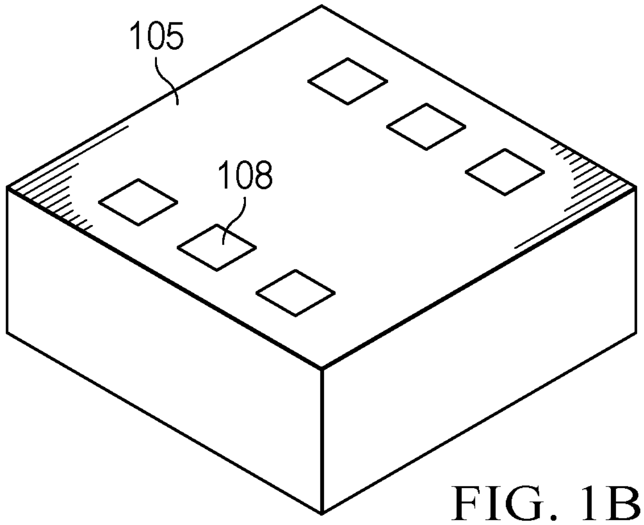

FIGS. 1A and 1B illustrate, in two projection views, a semiconductor wafer 101 having semiconductor devices formed on it (FIG. 1A), and an individual semiconductor die 105 from the wafer 101 for wire bonding and face up mounting (FIG. 1B), respectively. In FIG. 1A, a semiconductor wafer 101 is shown with an array of semiconductor dies 105 formed in rows and columns on a device side surface. The semiconductor dies 105 can be formed using processes typically used in a semiconductor manufacturing facility, including ion implantation, substrate doping, thermal anneals, oxidation, dielectric and metal deposition, sputter, photolithography, pattern, etch, strip, chemical mechanical polishing (CMP), electroplating, and other processes for making semiconductor devices on wafers. Scribe lanes 103 and 104, which are perpendicular to one another and which run in parallel groups across the wafer 101, separate the rows and columns of the completed semiconductor dies 105, and provide areas for dicing the semiconductor wafer 101 so as to separate the semiconductor dies 105 from one another.

FIG. 1B illustrates a single semiconductor die 105 after singulation from the semiconductor wafer 101, with bond pads 108, which are conductive pads that are electrically coupled to devices (not shown) formed on a device side surface of the semiconductor die 105. The bond pads 108 are positioned for connection to leads of a semiconductor device package.

Figure 2:
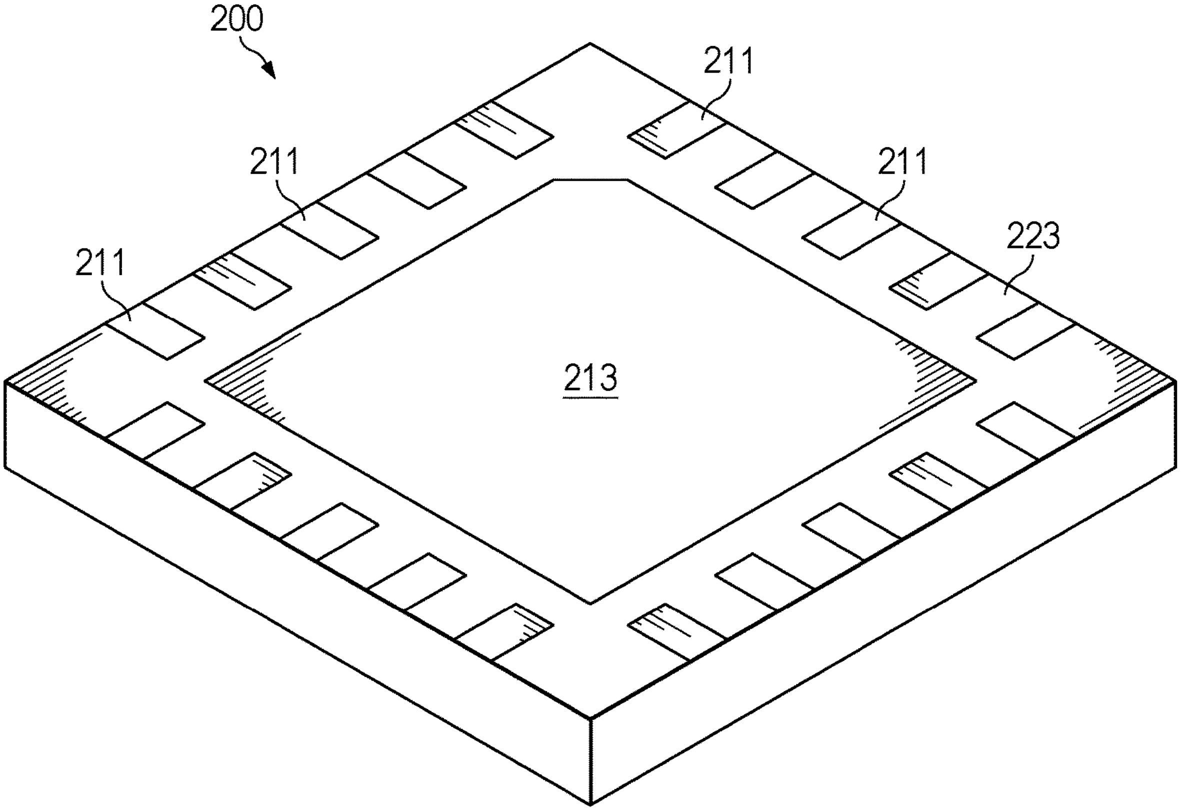
FIG. 2 illustrates in a projection view from a board side, a quad flat no-lead (QFN) semiconductor device package that is useful with the arrangements.

FIG. 2 illustrates, in a projection view from a board side, a quad flat no-lead (QFN) semiconductor device package 200 that is useful with the arrangements. In the illustrated example, the semiconductor device package 200 has terminals 211 for surface mounting to a board using solder. Die pad 213 is exposed from the mold compound 223 that forms the package body, and can be used as a thermal path to remove excess heat from a semiconductor die (not visible) mounted within the semiconductor device package 200. Other no-lead semiconductor packages can be used with the arrangements such as small outline no-lead (SON) package. Alternatively, leaded packages such as small outline integrated circuit (SOIC) or dual in-line package (DIP) semiconductor packages can be used with the arrangements. To reduce size and volume of systems formed using semiconductor devices, reduction in semiconductor package sizes is continuously desired. No-lead semiconductor device packages take less board area for package mounting and are increasingly used. While the illustrated examples are for no-lead packages, the arrangements can also be used with leadframes for leaded semiconductor device packages.

Figure 3A:
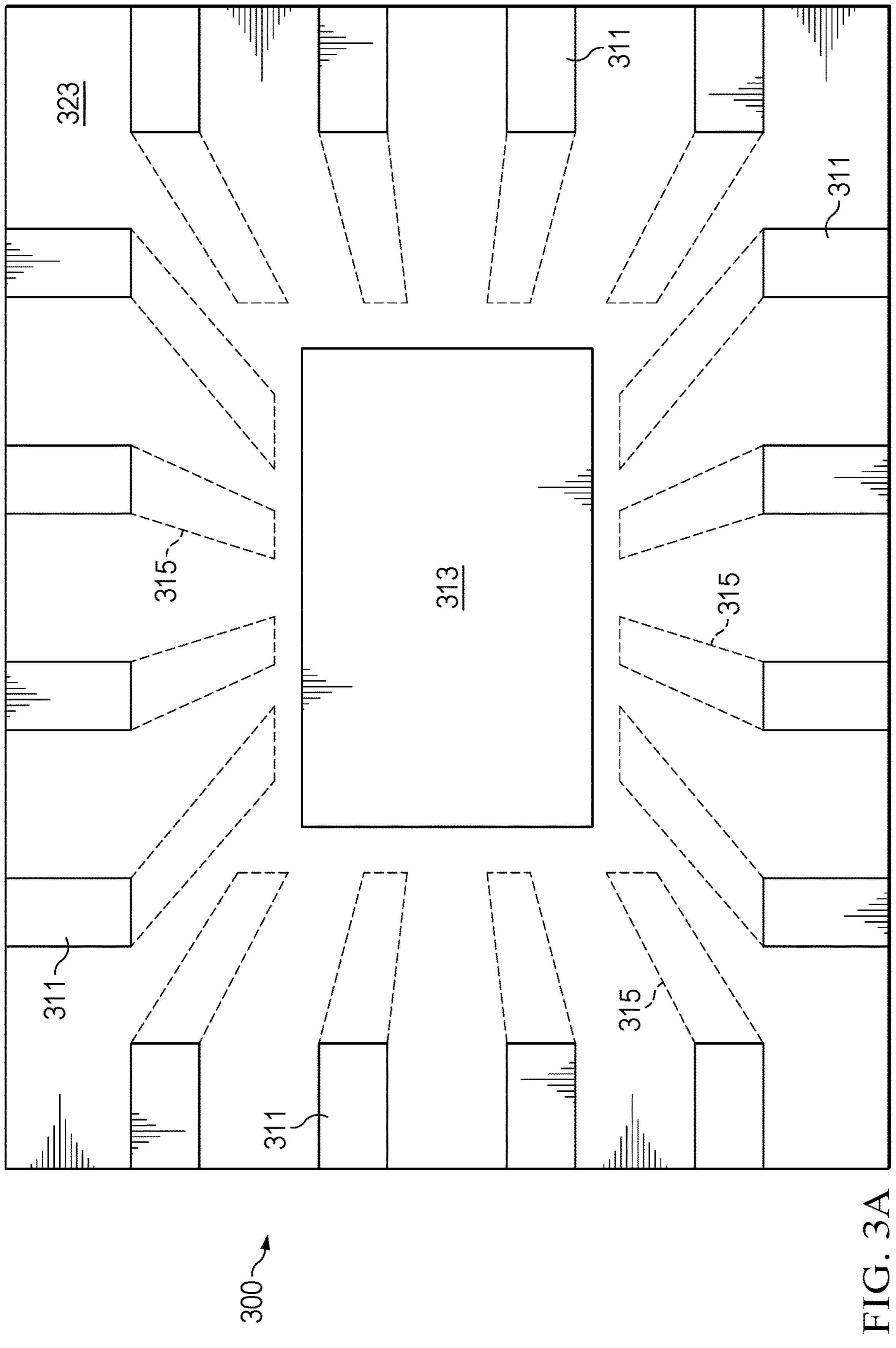
FIG. 3A illustrates in a board side or bottom view.

FIG. 3A illustrates, in a bottom view of a board side surface, a semiconductor device package 300 for use with an example arrangement. In FIG. 3A an example QFN package is shown. Terminals 311, which are configured to be surface mounted (similar to terminals 211 in FIG. 2), are portions of leadframe leads 315, the terminals 311 are parts of leads 315 that are exposed from mold compound 323. A die pad 313 is also a part of the leadframe and has a full thickness, and so the board side surface of the die pad 313 is exposed from the mold compound 323.

Figure 3B:
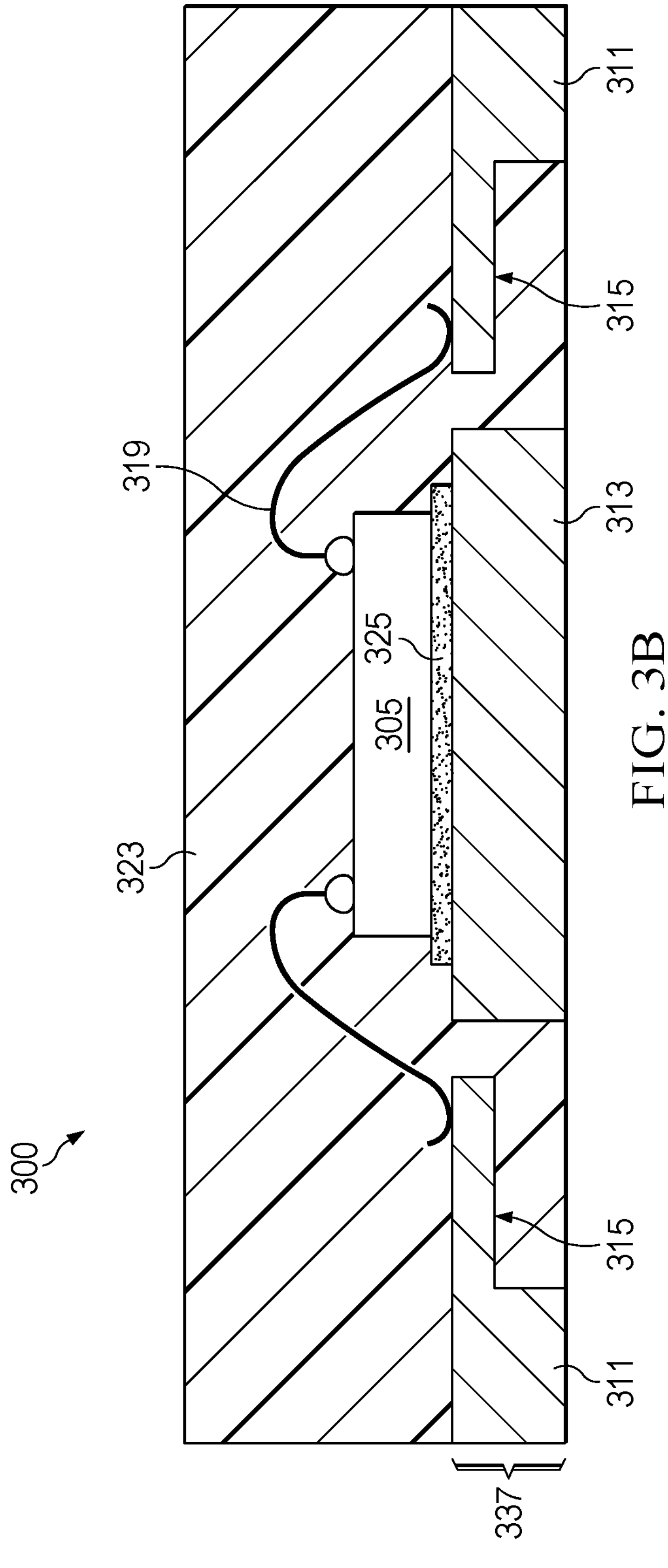
FIG. 3B illustrates in a cross-sectional view; respectively, a semiconductor device package useful with an example arrangement.

FIG. 3B illustrates the semiconductor device package 300 of FIG. 3A in a cross section. In FIG. 3B, a semiconductor die 305 is shown mounted by a die attach material 325 to a device side surface of die pad 313, which is a central portion of a leadframe 337. The leadframe 337 has leads 315 which have an interior end that is proximal to and spaced from the die pad 313. Leadframe 337 can be of copper, plated copper, Alloy 42, stainless steel or other conductive metals and alloys. In an example arrangement, a copper leadframe is used. The leadframe 337 can be partially etched or stamped from a sheet material, for example. The leads 315 are formed with a partial thickness at the interior end, and a full leadframe thickness at the terminal ends, terminals 311 are formed by exposing a portion of the leads 315 from the mold compound 323. The leads 315 can be shaped in a partial etching process. In a partial etching process, areas of the leadframe 337 can be completely etched to form spaces or holes, or the leadframe can be selectively partially etched from one side, or from the opposite side, to form areas of varying thicknesses. A sheet material such as a copper sheet can be used as a starting material and patterned using full etch and partial etch processes. Stamping can be used to pattern leadframes. Areas of a copper leadframe that are to be soldered can be plated or tinned to prevent corrosion and increase solderability. Areas for wire bond connections can be plated to increase bond strength and also to reduce or eliminate diffusion and oxidation or tarnish. Plating can include gold, palladium, nickel, silver, tin, and combination layers such as electroless nickel immersion gold (ENIG) and electroless nickel, electroless palladium and immersion gold (ENEPIG). Silver spot plating can be used.

The semiconductor die 305 is electrically connected to leads 315 of the leadframe 337 by bond wires that form wire bonds 319. Wire bonds 319 are conductive wires that are connected from bond pads on the semiconductor die 305 to the leads 315 in a wire bonding tool. The wire bond connections can be made using bond wires of gold, copper, palladium coated copper, aluminum or silver. In an example, a copper bond wire of about 20 microns in diameter is used. Other diameters of bond wire can be used, depending on materials chosen for the bond wire and desired electrical characteristics of the bond wire. Useful examples include 15 microns, 20 microns, 25.4 microns, 33 microns, and 50 microns of diameter for copper and palladium coated copper bond wires.

In an example wire bonding process, a wire bond begins with an exposed end of a bond wire extending from an opening in a capillary of the wire bonding tool. The capillary is a hard material such as a ceramic. Aluminum oxide (alumina), aluminum zirconium, or other ceramics can be used. The capillary has a bottom surface configured to be used to press the bond wire against a bond pad or lead during bonding. In a conventional bonder, a heat source such as a flame or more frequently an electric spark is used to melt the exposed end of the bond wire beneath the capillary to form a free air ball on the end of the bond wire. The free air ball is then mechanically pressed onto a bond pad using the surface of the capillary to apply mechanical pressure, and in many examples, ultrasonic energy is applied during ball bonding to create a bond between the ball formed on the end of the bond wire and the bond pad. The semiconductor device and the leadframe may be heated to further improve bonding in a conventional wire bonder. The bond pads can be formed of metallization material used in semiconductor processes including aluminum and copper bond pads and alloys of these. In a conventional wire bonder, the wire bonding tool may include heater blocks to support and heat the semiconductor die and the leadframes to provide thermosonic wire bonding, using heat, mechanical pressure, and ultrasonic energy in combination to form the bonds.

After the ball is bonded to a bond pad, the capillary of the wire bonding tool moves over a portion of a conductive lead to a stitch bond location, and a stitch bond can be formed on the surface of the lead. While the capillary is moving, the bond wire is allowed to extend from the ball bond on the bond pad through the capillary opening, and the bond wire is shaped in an arc above the leadframe and the semiconductor die, and then the bond wire is pulled down to a stitch bond location on the leadframe lead. The capillary then makes a mechanical stitch bond to the lead by pressing the bond wire against the lead, again using ultrasonic energy. As the capillary moves away from the stitch bond on the lead, the bond wire is then cut at a short distance from the lead. A short tail is left extending from the end of the capillary, and the process can repeat for the next wire bond.

In the arrangements, as is further described below, a wire bonding process uses lasers in the wire bonding process. In a described example process, a first laser is used to form a free air ball at the end of a bond wire, and a second laser is used to create a molten portion of a bond pad or a conductor for forming metal bonds. Because the lasers create a molten pool of material at the bond locations on the bond pads and on the conductive leads, the need for ultrasonic energy for effective wire bonding is eliminated. Advantages accrue by use of the arrangements in that damage to the bond pad material that occur due to ultrasonic energy moving the capillary is reduced or eliminated, and the use of the arrangements eliminates the need for an ultrasonic generator, which lowers costs for the wire bonder tool. Use of the lasers to create a molten pool of copper, for example, with a copper free air ball on a copper bond wire, results in a copper-to-copper bond without any intermetallic compound (IMC) that can occur in conventional wire bonding processes. A copper-to-copper bond is formed, which has low resistivity, increasing performance. The small heat affected zone created by use of a focused laser on the bond pad, and on the conductive lead, reduces or eliminates the need for heating of the entire semiconductor die and of the leadframe. Rapid cooling after the bonds are formed, due to the small heat affected zone, enables increasingly rapid bonding operations since the capillary can move to the next bond quickly, increasing throughput and lowering costs per device. Heat stress on sensitive components fabricated in the semiconductor die can also be reduced by use of the arrangements.

FIGS. 4A-4E illustrate, in a series of views, selected steps for forming a packaged semiconductor device such as can be used with an example arrangement.

Figure 4A:
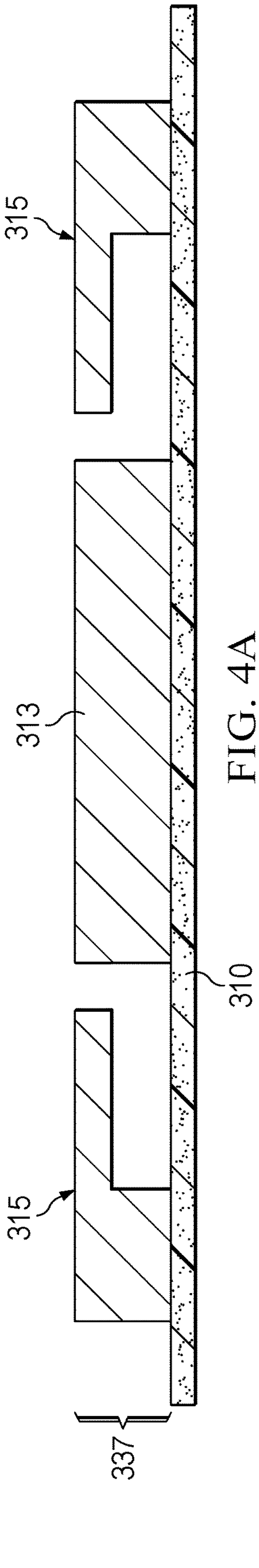
FIGS. 4A-4E illustrate, in a series of views, selected steps for forming semiconductor device packages useful with the arrangements.

FIG. 4A illustrates, in a cross-sectional view, a leadframe 337 mounted on a tape 310 for use in the packaging process. The leadframe 337 can be formed by a stamping or etching process of a sheet material for the leadframe, and may be of copper, copper alloy, Alloy 42, stainless steel, steel, or another conductor. In an example the leadframe 337 is copper or a copper alloy. The leadframe 337 has a die pad 313 and leads 315 spaced from the die pad 313. During processing, the leads can be temporarily connected to one another for support during processing by removable tie bars or dam bars (not shown) that are outside the cross-sectional view of FIG. 4A.

Tape 310 can be a removable adhesive film such as a QFN tape product available from INNOX Advanced Materials Company, Limited, of South Korea. In an example process tape 310 can be a polyimide film with an adhesive and a release film cover. A taping machine can be used to apply the tape to the board side surface of the leadframes in an automated process. The tape 310 can include a peelable adhesive so that when the tape 310 is removed after molding, the adhesive is easily removed or is removed along with the tape. Because heat is applied during processes such as molding, the tape is preferably heat resistant. Other removeable films can be used such as UV peelable films. The leadframe 337 and tape 310 can be combined and provided as a supplied component to the packaging process, and this part of the processing can be performed independently of the semiconductor fabrication processes, and at various locations, and asynchronously with respect to the rest of the processes.

Figure 4B:
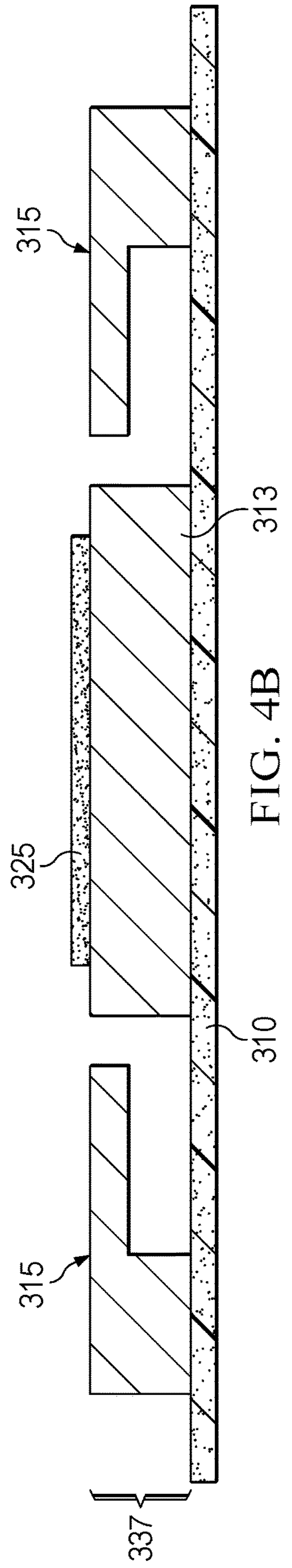

FIG. 4B illustrates the leadframe 337 of FIG. 4A after additional processing. To prepare for die mounting steps to follow, a die attach material 325 is first formed on the device side surface of die pad 313 of the leadframe 337. The die attach material 325 can be die attach epoxy. The die attach epoxy can be dispensed by a needle dispenser as a liquid or gel, and alternatively the die attach epoxy can be dispensed using an ink jet or "drop on demand" system, or by use of a stencil. The die attach material 325 can be a die attach tape or film. Because the die pad 313 has a board side surface that will be exposed from the mold compound in the completed semiconductor device package (see die pad 313 in semiconductor device package 300 in FIG. 3B), the die pad 313 provides a convenient thermal path for removing heat from a semiconductor die. Accordingly, the die attach material 325 can be thermally conductive. In addition, the die pad 313 can be coupled to a ground or bias potential. In some applications the die attach material 325 can be electrically conductive. Alternatively, in other applications, the die attach material can be electrically insulating when the semiconductor die to be mounted to the die pad is to be electrically isolated from the die pad 313.

Figure 4C:
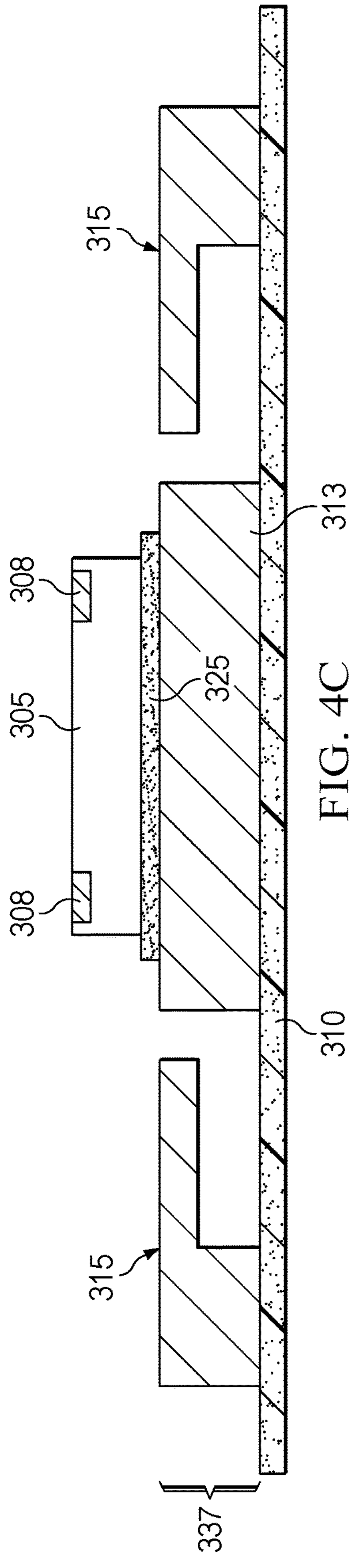

FIG. 4C illustrates in another cross sectional view the leadframe 337 of FIG. 4B after a die mounting operation. In an example process, a pick and place tool or other die handling tools can be used to place semiconductor die 305 on the die attach material 325 to mount the semiconductor die 305 to the die pad 313. The semiconductor die 305 is shown with bond pads 308, which can be aluminum, copper, alloys or plated metals, exposed and facing away from the die pad 313, in preparation for wire bonding. In the example arrangements illustrated, the bond pads 308 are of copper or a copper alloy. Leads 315 are spaced from the die pad 313 and from semiconductor die 305. The leads 315 have a partial thickness at the interior ends, and a full thickness of the leadframe 337 at the exterior ends away from the semiconductor die 305.

Figure 4D:
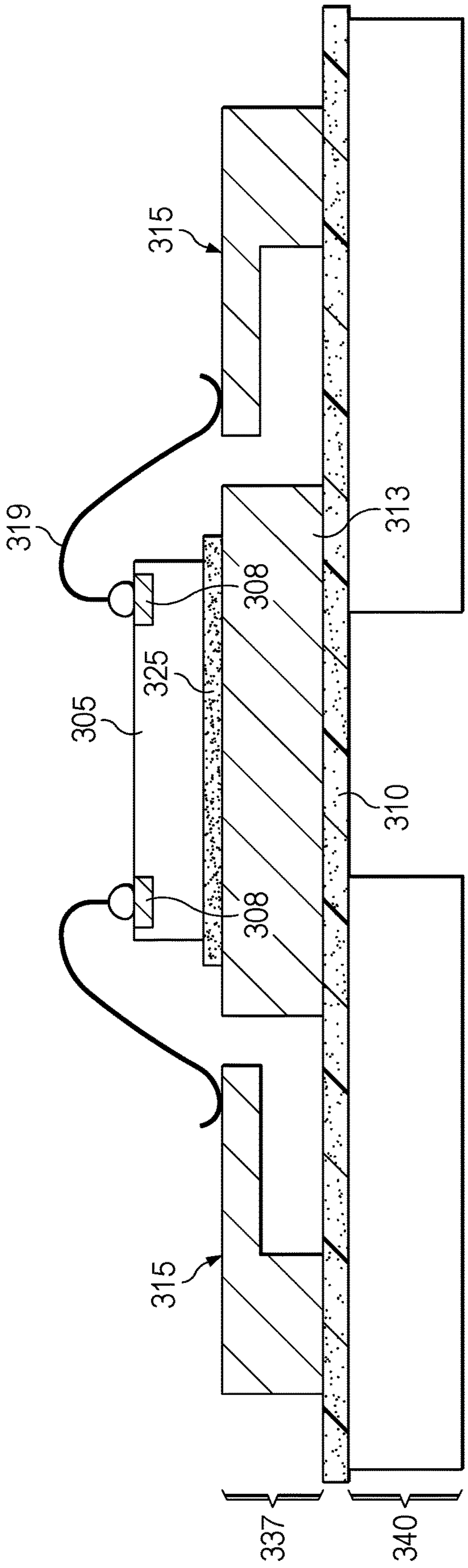

FIG. 4D illustrates in another cross section the semiconductor die 305 and leadframe 337 of FIG. 4C after additional processing. As shown in FIG. 4D, wire bonds 319 have been formed between bond pads 308 and the upper surface of the leads 315. In an example wire bonding process, a wire bonding tool has a capillary with a surface for making ball bonds and stitch bonds on surfaces, and has a central opening. The capillary can be made of a ceramic, a metal or other hard material. Example capillary materials include ceramics such as alumina, or aluminum zirconium. Tungsten can be used. An end of a bond wire is allowed to protrude through the capillary opening to a short distance. In the arrangements, a first laser is focused on the end of the bond wire and used to heat the end of the bond wire to form a ball. In the arrangements, a second laser is focused on a bond location on the bond pad and simultaneously with the ball formation, or contemporaneously, the second laser forms a molten pool in the bond pad surface at the bond location. The wire bonder moves the capillary over a bond pad and using mechanical pressure forces the ball against the molten surface of the bond pad and forms a ball bond to the bond pad.

In a particular example arrangement, copper bond wire is used with copper bond pads, and a copper-to-copper bond is formed between the ball and the bond pad. The bond wire remains attached to the ball bond. As the capillary is moved above the bond pad, the bond wire extends through the opening in the capillary and forms an arc or curved shape. The capillary extends the bond wire over the leadframe and aligns with a predetermined bond location, and is positioned over a lead. A laser is focused on the bond spot and forms a molten area on the lead at the bond spot. The capillary then presses the bond wire against the lead and forms a stitch bond on the lead. Again, in an example the leadframe has copper leads, and a copper bond wire is used, so that a copper-to-copper bond is formed between the bond wire and the molten pool on the copper lead. As the capillary moves from the stitch bond, the bond wire is cut and the cut end of the bond wire extending from the capillary is used to form the next ball is a repetitive process. The wire bond may have a short tail extending from the stitch bond. Use of the lasers with the capillary in a method of the arrangements is further detailed in FIGS. 5A-5H described below.

Figure 4E:
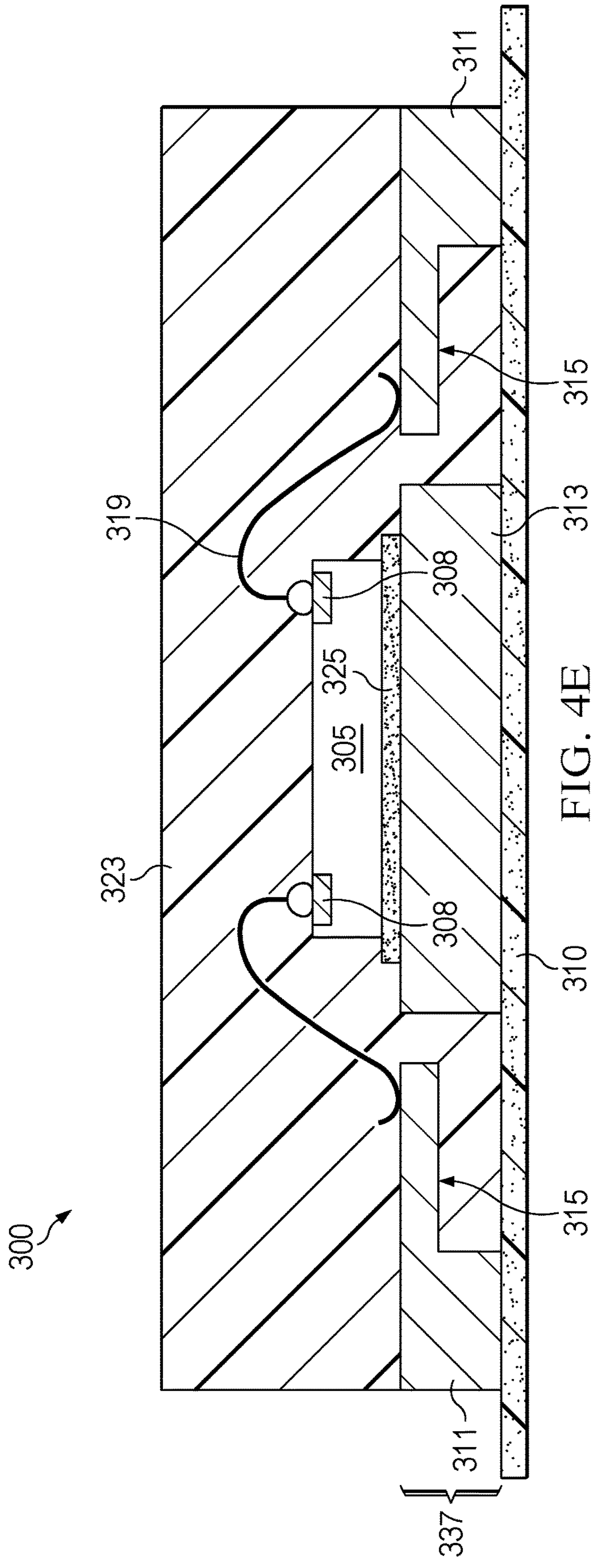

FIG. 4E illustrates, in a further cross section, a semiconductor device package 300 formed by additional processing on the semiconductor die 305 of FIG. 4D. In FIG. 4E, mold compound 323 has been formed over the semiconductor die 305, the wire bonds 319, and portions of the leadframe 337. Portions of the leads 315 such as the board side surfaces of the exterior ends of the leads, where the full thickness is used, are exposed from the mold compound to form terminals 311 (see 311 in FIG. 3A, for example). Terminals 311 are arranged for surface mounting the package to a system board. The board side surface of the die pad 313 is also exposed from the mold compound. The mold compound can be an epoxy mold compound (EMC), an epoxy, a resin, or a plastic.

In an example molding process, a transfer mold is used. Solid thermoset resin, which can be a pellet or a powder, is heated to a liquid state. A ram forces the now liquid mold compound through runners into molds in a mold chase where the leadframes are positioned holding the semiconductor dies, the bond wires, and the leads in position while the mold compound flows into the molds. The mold compound is then allowed to cure and cools to a solid package around the semiconductor dies and the leadframes. As shown in FIG. 4E, after the mold step the tape 310 remains in place. To complete the semiconductor device package as shown in FIGS. 3A-3B the tape 310 is removed from the board side surface of the semiconductor device packages. A singulation step may be performed to cut unit devices from a leadframe strip or array and singulate the semiconductor device packages one from another.

FIGS. 5A-5H illustrate, in a series of steps, a method of the arrangements using lasers to assist in a wire bonding process.

Figure 5A:
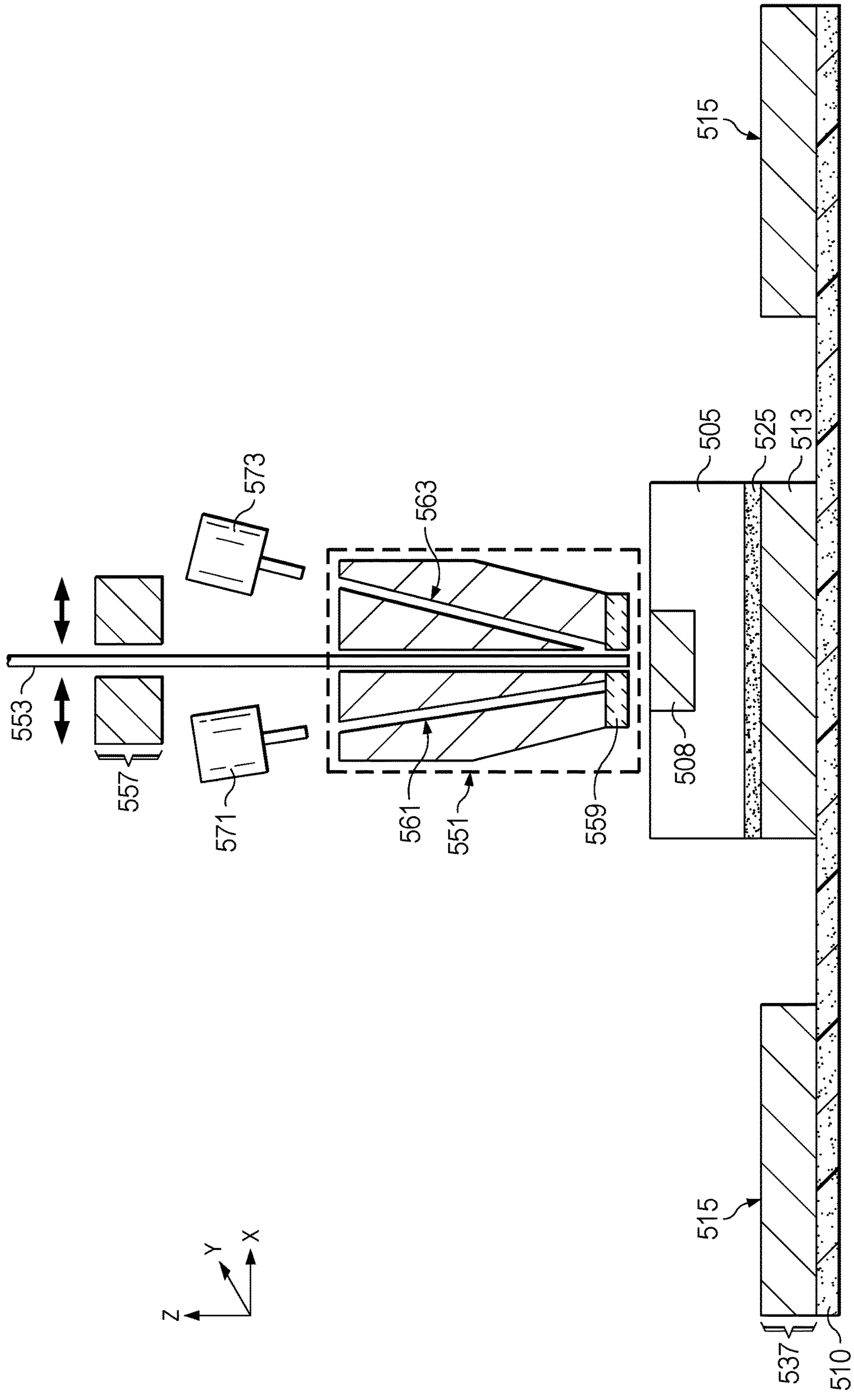
FIGS. 5A-5H illustrate, in a series of views, selected steps for forming a wire bond using a method and wire bond tool of the arrangements.

In FIG. 5A, a capillary 551 of a wire bonding tool is shown positioned over a bond pad 508 of a semiconductor die 505. The semiconductor die 505 is shown mounted on a die pad 513 of a leadframe 537, which is similar to leadframe 337 in FIG. 4E for example. Die attach material 525 is used to mount the semiconductor die 505 to the die pad 513. Leads 515 of the leadframe 537 are spaced from die pad 513, and are configured for wire bonding. In FIG. 5A, the capillary 551 is enhanced by the use of a first laser source 573 and a second laser source 571. The laser sources can be mounted to the capillary or mounted to direct laser beams to the capillary using, for example, optical fiber to guide the laser beams.

The capillary 551 has a central opening with bond wire 553 extending through it. The bond wire 553 can be gold, copper, plated copper, silver or aluminum. In the illustrated example copper bond wire is used. The bond wire 553 can have a diameter between 8 and 70 microns. The opening in the capillary 551 is larger than the bond wire diameter to allow the bond wire to pass through it, and can be between 35 and 100 microns. A wire clamp 557 is arranged to selectively hold the bond wire 553, or the wire clamp 557 can be opened to let it extend. Bond wire 553 is supplied from a spool or other wire supply (not shown). The bottom end of the capillary 551 is sized to fit within a bond pad opening, and can be less than 100 microns in diameter, for example from 50-100 microns.

In an aspect of the arrangements, the capillary 551 is arranged for use of laser energy, and has a lens or optical cover 559 at the bottom that allows transmission of the light from the laser sources 573, 571. In the illustrated example first laser path 563 is used to direct laser energy from the first laser source 573 to the end of the bond wire 553, to allow for formation of the needed free air ball by melting the end of the bond wire 553. A second laser path 561 is formed in one part of the capillary 551, and has a medium for laser transmission such as a fiber optic cable for laser energy, the second laser path 561 is positioned to receive laser beams from the second laser source 571 and to direct the laser beams onto a bond location on the bond pad 508 The example arrangement shown in FIG. 5A has two laser paths, a first laser path (563) for a first laser (573) is used to direct laser beams from the first laser source 573 for forming the free air ball; while a second laser path (561) for using a second laser source 571 for melting the bond pad in a first heat affected zone, or on a lead of a leadframe conductor, to form a second heat affected zone at a stitch bond location. In an alternative arrangement, a single laser is used with beam splitters or mirrors to direct laser beams to the two laser paths. In the illustrated example the capillary 551 includes laser paths 563 and 561. In an additional alternative arrangement, the lasers can be mounted separately from the capillary 551, and the lasers can be focused on the appropriate position as described below. Fiber optic laser paths can be mounted on the capillary or have separate mounts, so that the lasers are focused on the appropriate spots during the bond process. A single laser source can be used to create multiple beams for use in the methods. A third or even a fourth laser source can be used to create laser beams for different steps in the methods, in additional alternative arrangements.

In the illustrated examples, two lasers are used. Using two lasers, one for the free air ball formation and one for the bond location, for the ball bond operations eliminates the need for the EFO system used in conventional ball bonders. Further, the two lasers are used in the methods of the arrangements during the stitch bonding operations, one to create a molten area in a second heat affected zone on a lead of a package substrate, and the other to heat the bond wire at the stitch location during the stitch bonding.

Figure 5B:
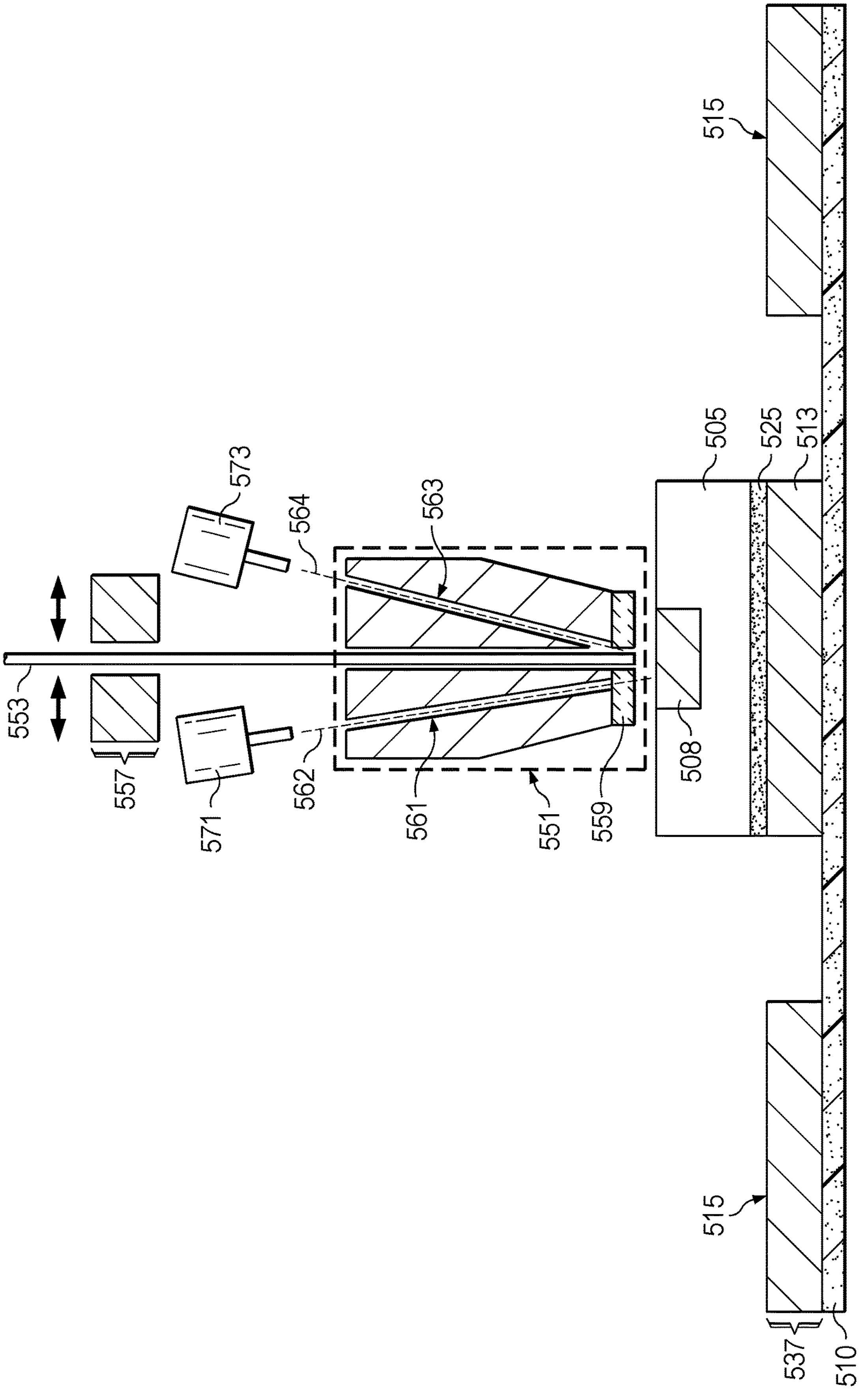

FIG. 5B illustrates the elements of FIG. 5A in a subsequent operation in the wire bonding cycle. In FIG. 5B, the first laser source 573 outputs laser beam 564, which is directed by the laser path 563 in capillary 551 to apply laser energy to form a free air ball on the end of the bond wire 553 below the lens 559 of capillary 551. Simultaneously, or contemporaneously, the second laser source 571 outputs a second laser beam 562 that is directed by the second laser path 561 to a bond location on bond pad 508. In one approach using the arrangements, the two lasers are energized simultaneously. In another approach, the two lasers can be operated independently but in rapid succession in any order so that the free air ball formed on the bond wire 553 will be molten during the time the molten area on the bond pad 508 forms. The semiconductor die 505, the leadframe 537, the leads 515, the die pad 513, and the die attach material 525 are shown as in FIGS. 5A-5B, supported by die support 510.

The second laser beam 562 can have a focused spot on the bond pad 508 of between 50 and 200 microns in diameter, similar in size to the diameter of the free air ball. This laser spot will form a small heat affected zone (see first heat affected zone 567 in FIG. 5C) in the bond pad 508, for example of less than 200 microns. Because the heat affected zone at the bonding location is small (compared to heating the entire bond pad, as has been done in conventional bonding processes), the ball bond will rapidly cure and harden, allowing for an increase in speed for the bonding process. The use of the laser enhanced wire bonding in the arrangements restricts the heating of the semiconductor die to the small heat affected zone at the surface of the bond pads, reducing thermal stress on other components in the semiconductor die (as compared to conventional wire bonding, performed with the leadframe and the semiconductor die being heated throughout). A similar second small heat affected zone is formed on the leads of the leadframe during stitch bonding, again reducing thermal stress on the components. In addition, use of the laser enhanced wire bonding methods of the arrangements can reduce or eliminate the need for heating the devices during wire bonding, for example wire bonding can be done at an ambient or room temperature (between 15 and 40 degrees C.) without the use of the heaters used in conventional wire bonding tools to heat the semiconductor dies and the leadframes.

Figure 5C:
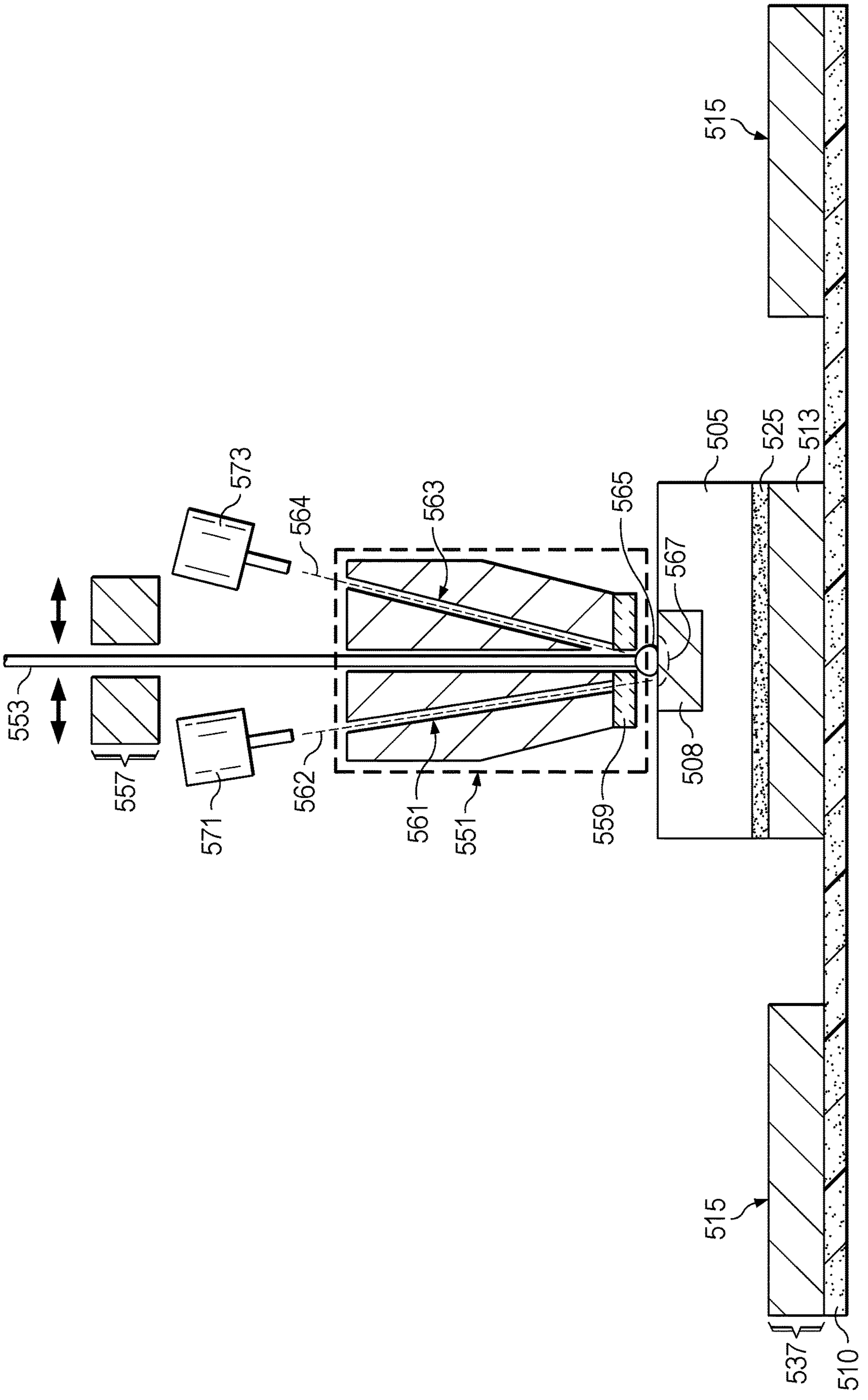

FIG. 5C illustrates the elements of FIG. 5B showing the free air ball formation and the forming of a molten area in a first heat affected zone 567 of the bond pad 508, using the two-laser beam arrangement. In FIG. 5C, a free air ball 565 is shown forming on the end of the bond wire 553 extending from the capillary 551, and a molten area or heat affected zone 567 of bond pad 508 is also shown. The free air ball 565 and the molten area 567 are formed by the operation of the second laser source 571, transmitting laser beam 562, and a first laser source 573, transmitting laser beam 564. Laser beam 562 is focused to melt a small portion of the copper bond pad 508 to form the heat affected zone 567, and laser beam 564 is focused to form the free air ball on the end of copper bond wire 553. The semiconductor die 505, the leadframe 537, the leads 515, the die pad 513, and the die attach material 525 are shown as in FIG. 5A, supported by die support 510. The laser beams 564 and 562 melt the material quickly, and use of the second laser beam 562 to form the molten area in the heat affected zone 567 on the bond pad 508 eliminates the need for "scrubbing" the bond pad 508 to break any oxides or tarnish that might be formed on the surface of bond pad 508, so that the need for the use of conventional ultrasonic energy is eliminated. Eliminating the use of ultrasonic energy reduces costs of the bonding tool, and reduces damage to plating on the bond pads used to reduce corrosion and defects.

While not shown for simplicity of illustration, copper wire bonding can be performed in an anoxic environment to reduce oxidation during bonding. Because copper bond wire and copper bond pads oxidize easily, a nitrogen or other oxygen free gas can be applied to the bonding area during the bonding process, to further retard or prevent oxidation. The laser enhanced wire bonding of the arrangements can enable wire bonding without the need for a heater block to heat the semiconductor die and the leadframe, which reduces the temperature during bonding, this aspect of the arrangements also advantageously reduces unwanted copper oxidation, which accelerates at higher temperatures.

Using the arrangements enables a copper-to-copper bond between the bond wire 553 and the bond pad 508 when the molten free air ball 565 is brought into contact with the molten area in heat affected zone 567 of the bond pad 508. The capillary 551 moves the molten free air ball 565 to the molten area 567 to form the copper-to-copper bond, in an example where copper bond wire is used for bond wire 553, with a copper bond pad used for bond pad 508. The die pad 513, the leads 515 of the leadframe 537, die support 510 are arranged as shown in FIG. 5A. As shown in FIG. 5C, both laser beams 564 and 562 can be applied simultaneously during the ball bonding step to ensure a molten free air ball meets the molten area of the bond pad and forms a copper-to-copper bond.

Figure 5D:
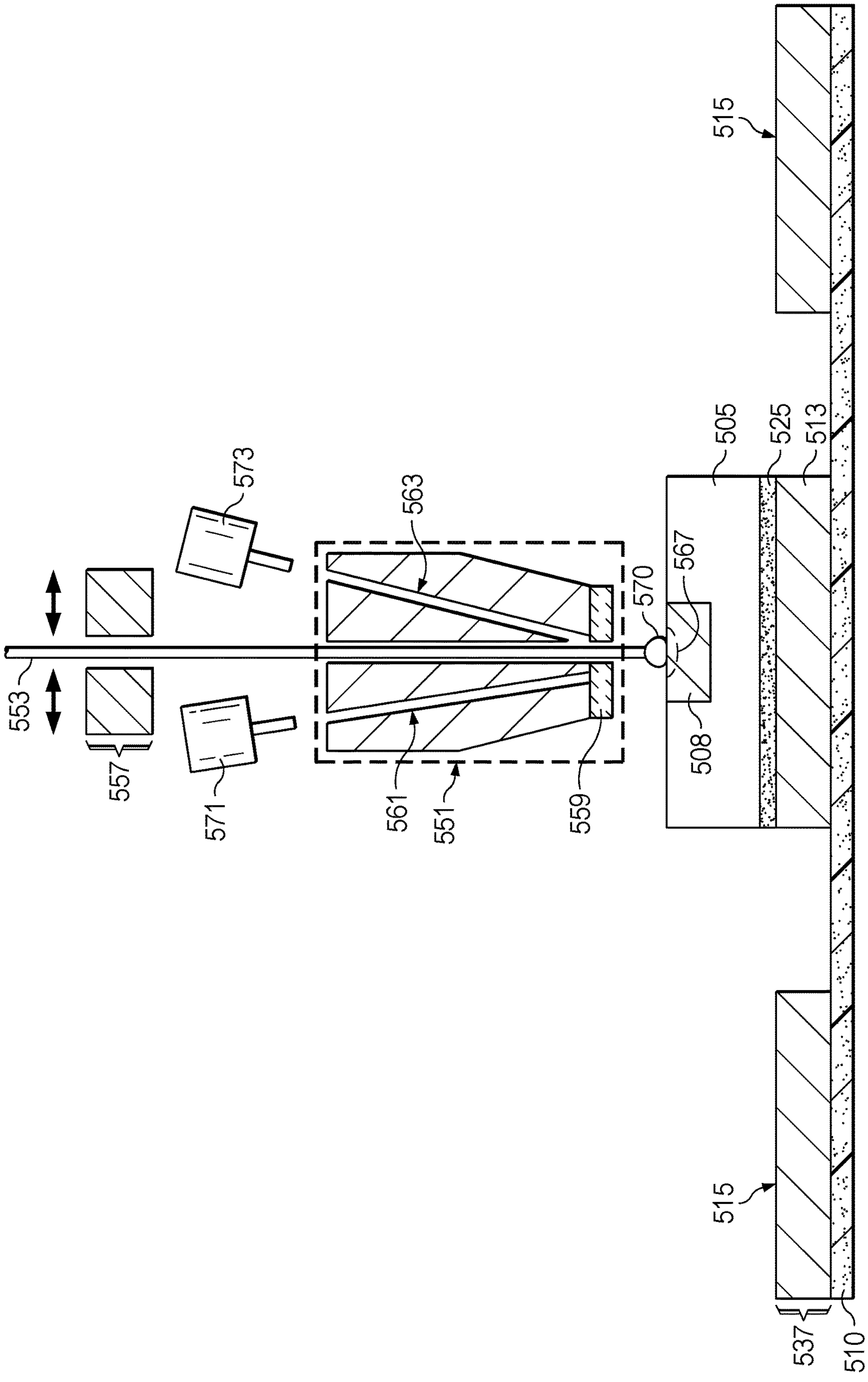

FIG. 5D illustrates the elements of FIG. 5C showing subsequent steps in the wire bonding process. In FIG. 5D, the ball bond 570 is shown formed on the bond pad 508 at the heat affected zone 567. The molten area in heat affected zone 567 will cool and harden and is of less than 200 microns in diameter, corresponding to the laser spot size. As shown in FIG. 5D, the capillary 551 has moved upwards from the bond pad 508, allowing the bond wire 553 to extend to a position where a bond wire loop will be formed, setting the loop height. The looped shape of the bond wires used in wire bonding allows the wire bond to extend laterally over the semiconductor die 505 while the bond wire 519 is spaced from the die and die edges, preventing shorts that might otherwise occur. By selectively clamping the bond wire 553, and allowing it to extend through the capillary 551, the clamp 557 can be used to shape bond wire 553. The ball bond 570 and the molten area in heat affected zone 567 are a few times larger than the bond wire diameter, for example 2-3 times as large, which is a small area affected by the laser energy. The ball bond 570 and the molten area in the heat affected zone 567 will rapidly cool and the bonding process can proceed to the next bond quickly, increasing throughput (when compared to conventional wire bonding without lasers.) The bond between the ball bond 570 and the bond pad 508 is a copper-to-copper bond made in a molten state, and is a strong and low resistance metal to metal bond. In FIG. 5D, the leadframe 537, the leads 515, the die pad 513, die attach material 525, and the die support 510 are as shown in FIG. 5A. Note that while the illustrated example steps are described using copper bond wire, gold also absorbs and heats in response to blue laser energy, and the laser enhanced wire bonding can be used with gold or gold alloy bond wire and gold bond pads, for example, to form a gold-to-gold ball bond.

Figure 5E:
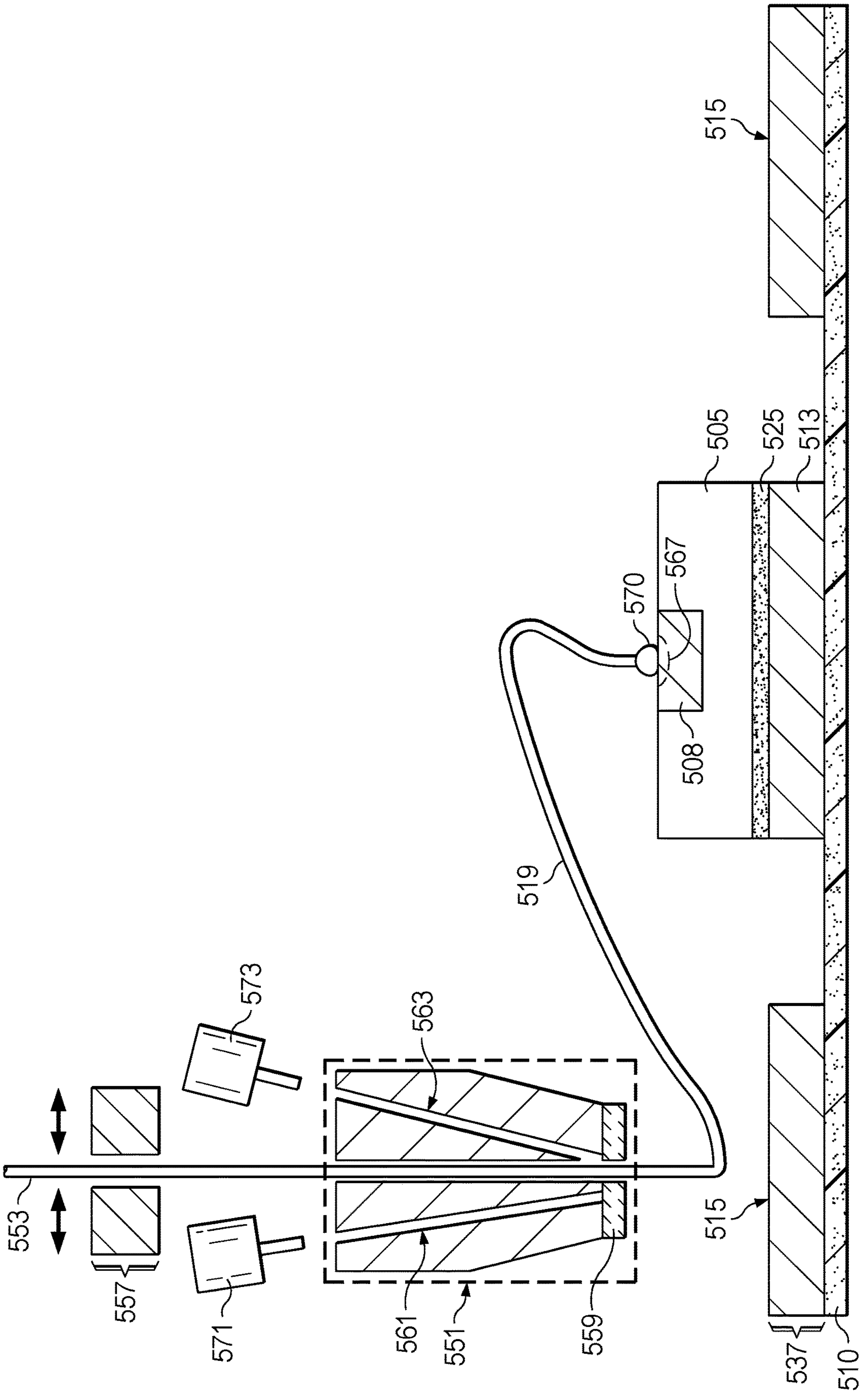

FIG. 5E illustrates the elements of FIG. 5D showing subsequent steps in the wire bonding process. In FIG. 5E, the wire bond 519 is shown extending from ball bond 570 on the bond pad 508 at the heat affected zone 567. The capillary 551 has now moved laterally away from the ball bond 570 allowing the bond wire 553 to extend and form the wire bond 519 as a curved loop. The capillary 551 is positioned over lead 515 of the leadframe 537, and carries the bond wire 553 in preparation for making a stitch bond on the lead 515. The clamp 557 is shown open but can be selectively closed to allow the capillary 551 to pull the bond wire 553 into the desired shape. The die pad 513, semiconductor die 505, the die attach material 525, the die support 510, and laser sources 573 and 571 are all shown as in FIGS. 5A-5D.

Figure 5F:
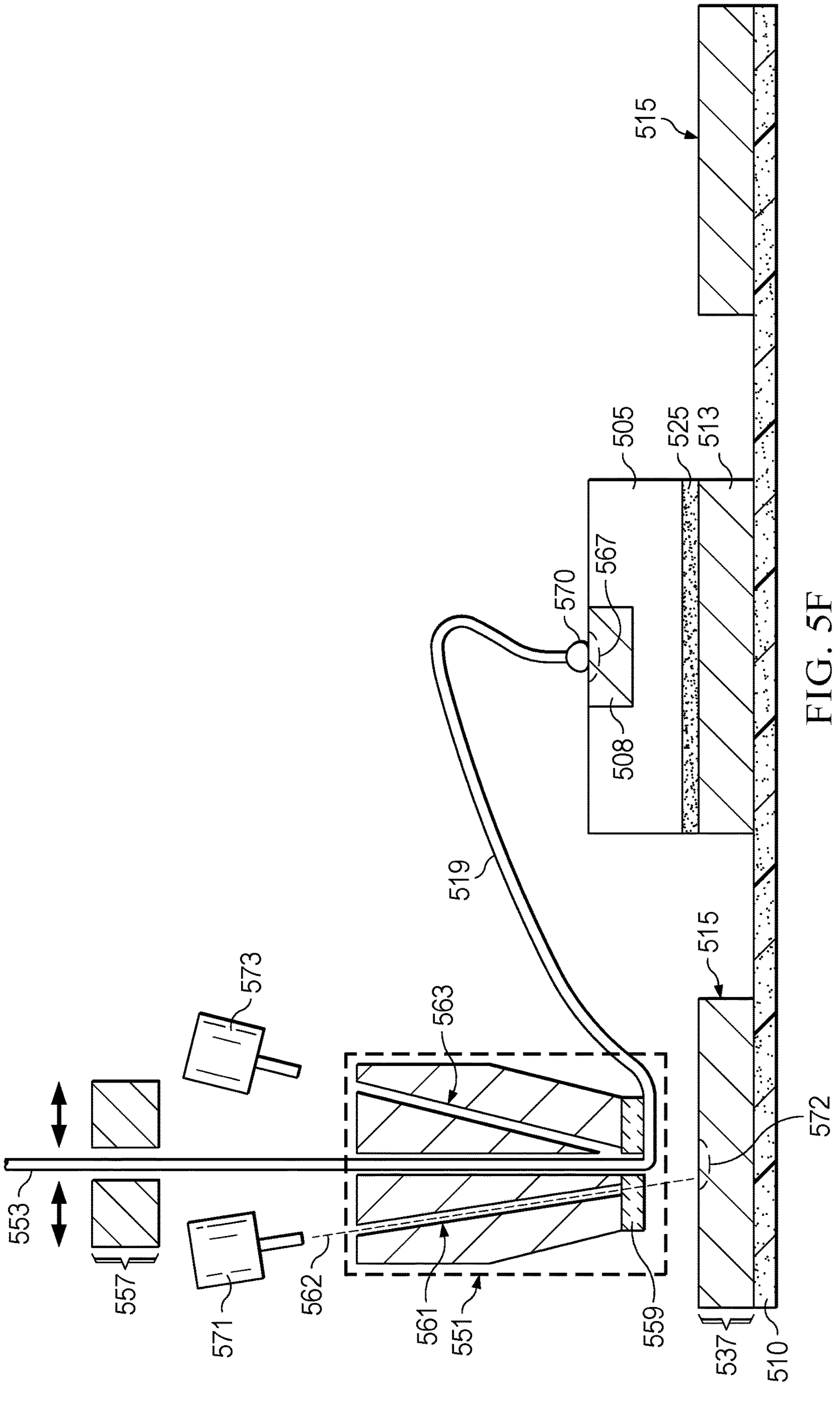

FIG. 5F illustrates the elements of FIG. 5E showing subsequent steps in the wire bonding process. In FIG. 5F, laser beam 562 is shown forming a molten portion in a heat affected zone 572 on the lead 515 in preparation for a stitch bonding operation. The capillary 551 is positioned above a stitch bond location. The laser beam 562 is shown directed from the second laser source 571 through the laser path 561 in the capillary 551. In an alternative arrangement, the laser beam 562 may be provided through an optical path that is not in the capillary 551. The lens 559 transmits the laser energy and can include optical elements to focus the laser beam 562. The clamp 557 is shown holding the bond wire 553 in place in preparation for the stitch bonding operation. The die pad 513, semiconductor die 505, the die attach material 525, the die support 510 are all shown as in FIGS. 5A-5E.

Figure 5G:
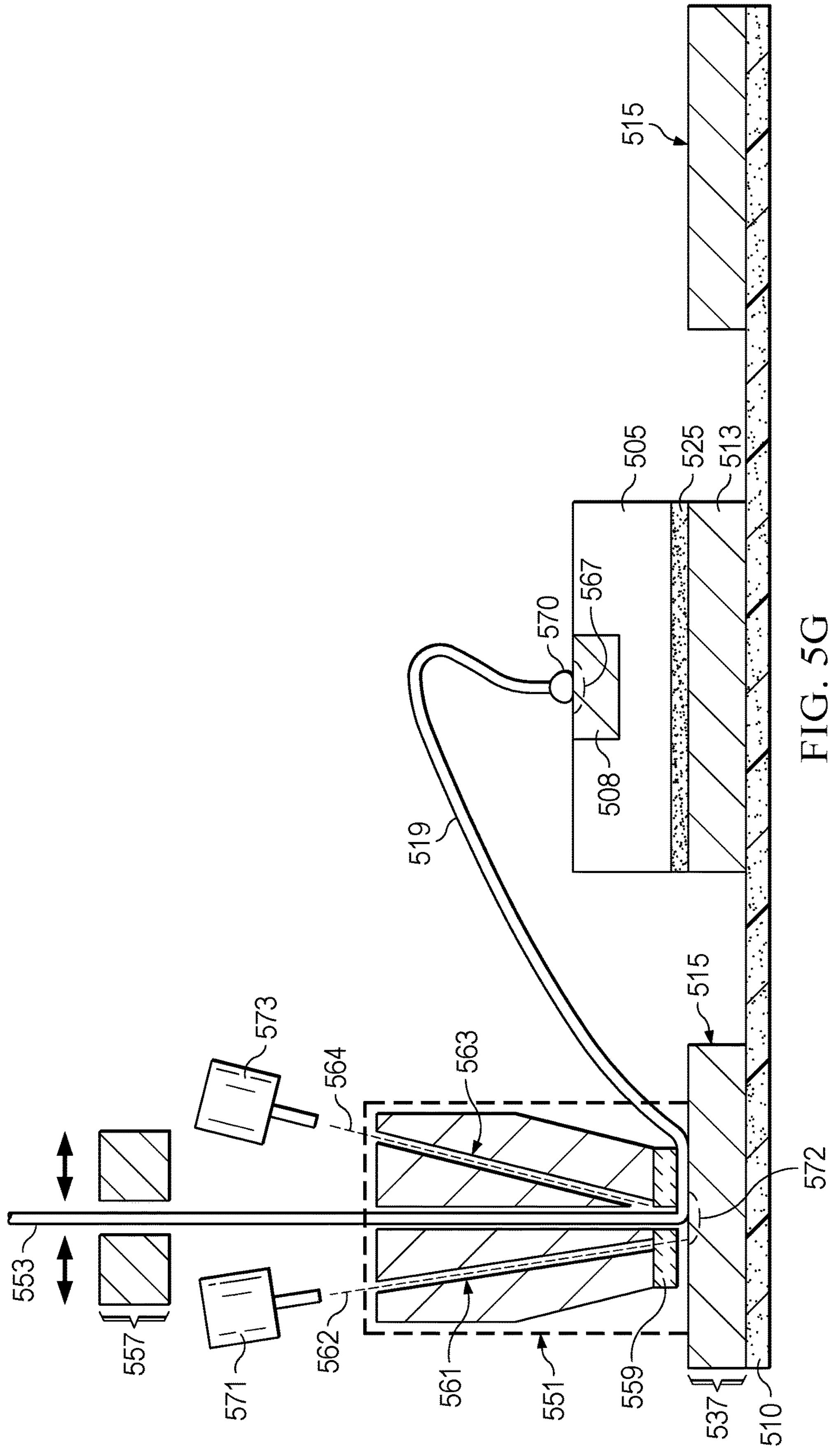

FIG. 5G illustrates the elements of FIG. 5F showing the stitch bond formation in the laser enhanced wire bonding process of the example arrangement. In FIG. 5G, laser beam 562 is shown forming the molten area in the heat affected zone 572 on the lead 515. The bond wire 553 is moved by the capillary 551 to form the stitch bond on the lead 515 by placing the bond wire 553 in the molten portion of the heat affected zone 572 on the surface of the lead 515. Simultaneously, the first laser source 573 transmits the laser beam 564 which is used to heat and partially melt the bond wire 553 at the stitch bond location. The molten metal in lead 515 will bond to the heated and partially melted bond wire 553 to form a stitch bond. The laser beams 564 and 562 can be stopped once the stitch bond is formed, and the molten metal allowed to cure by cooling. Because the molten area for the stitch bond is a small heat affected zone on the lead 515, the stitch bond will harden quickly, as the remainder of the lead 515 is not heated. This rapid cure is an advantage of the use of the arrangements, in contrast to the heated leadframe approach used in conventional bonders without the use of the laser enhanced wire bonding. The die pad 513, semiconductor die 505, the die attach material 525, the die support 510 are all shown as in FIGS. 5A-5F.

Figure 5H:
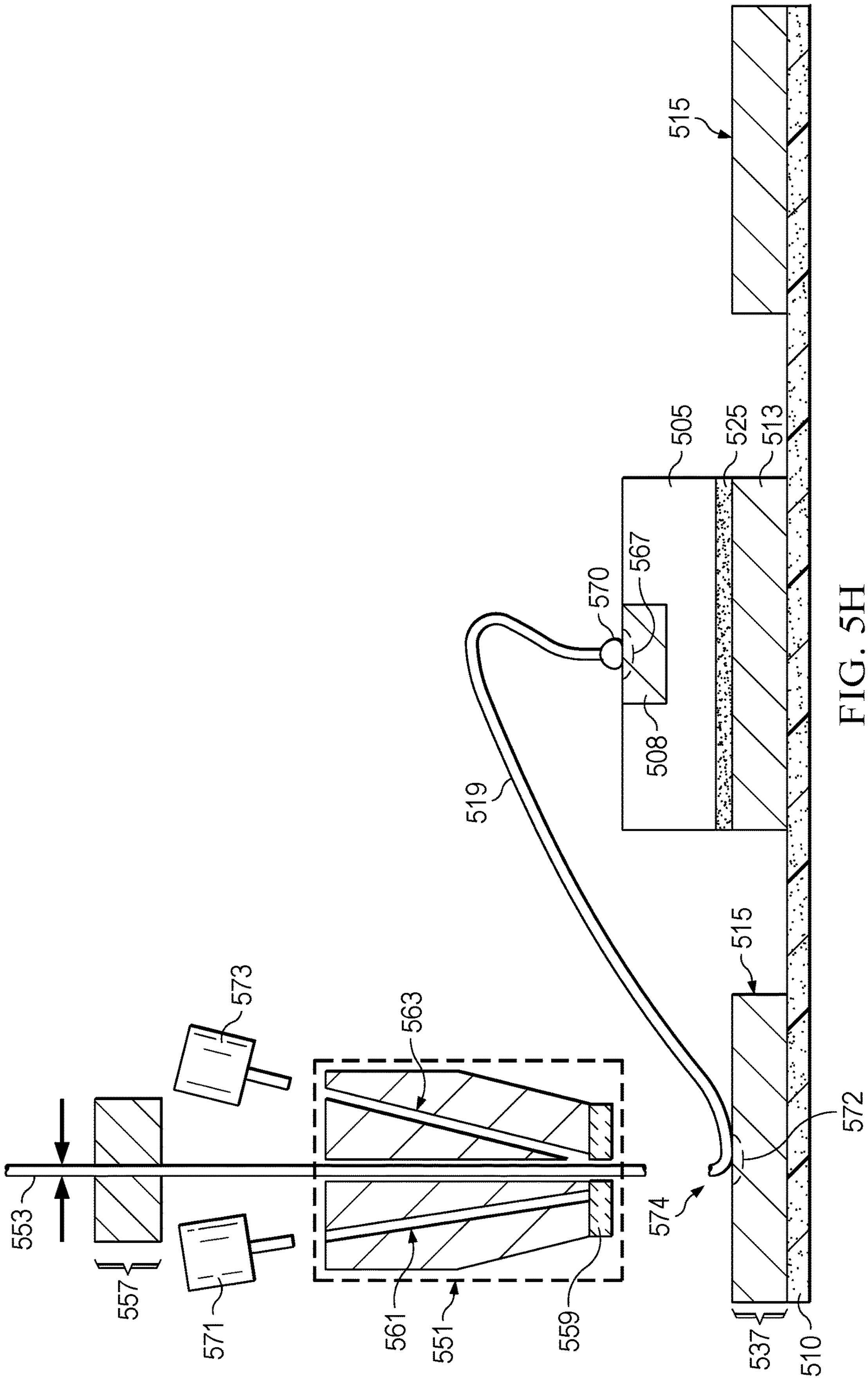

FIG. 5H illustrates the elements of FIG. 5G showing the wire bond 519 after the bonding process using the arrangements. In FIG. 5H, the wire bond 519 extends from the ball bond 570 on the bond pad 508 to the stitch bond 574 formed on the lead 515. The capillary 551 is shown after the wire clamp 557 is used to break the bond wire 553 and form a new end on the bond wire 553 for use in a subsequent ball bond. The process shown from FIGS. 5A-5H can be repeated for each wire bond 519 needed to complete the electrical connections for a semiconductor die to the leadframe leads.

Because the use of the arrangements selectively heats the bond locations on the bond pad 508 and the leads 515 by creating small heat affected zones (see heat affected zones 567, 572 in FIG. 5H) instead of using a heater block to heat the entire leadframe and the semiconductor die, the time for cooling the ball bonds and the stitch bond is reduced and the capillary 551 can rapidly move from one bonding site to another, increasing throughput.

In FIG. 5H, the capillary 551 is shown with first laser path 563 and second laser path 561 with the bond wire 553 and a wire clamp 557. A lens or optical cover 559 is shown on the bottom of the capillary 551. In additional alternative arrangements, instead of the laser paths being part of the capillary 551, the laser sources 573, 571 can be mounted independently from the capillary 551. In further arrangements, a single laser can be used with beam splitters, mirrors and fiber optics to form two laser beams.

When the arrangements are used with copper bond wire and copper bond pads, as are increasingly used, a copper-to-copper bond is formed at the ball bond and stitch bond locations. These bonds are formed as metal-to-metal bonds without the need for ultrasonic energy, and without use of a heater block. Because the laser enhanced wire bonding of the arrangements enables metal bonding without the need for ultrasonic energy, damage to the bond pads that has been observed in thermosonic wire bonding is reduced or eliminated. The thermal stress on components in the semiconductor die is reduced by use of the arrangements, as the semiconductor die may not be heated during the wire bonding process, instead only the ball bond and stitch bond locations are heated by the lasers.

Although the examples described above are described as using copper bond wire and copper bond pads, the arrangements can be used with other materials as well. For example, gold bond wire is commonly used and can be used with the arrangements. Aluminum bond pads can be used with copper or gold bond wire. Plating on the bond pads can be used including nickel, gold and palladium layers to increase bondability and reduce oxidation, tarnish and copper diffusion.

The wavelengths used in the lasers of the arrangements can vary but can be selected to be in frequencies that are highly absorbed by the materials used in the bond wire, the bond pads, and the leads of the package substrate.

Figure 6:
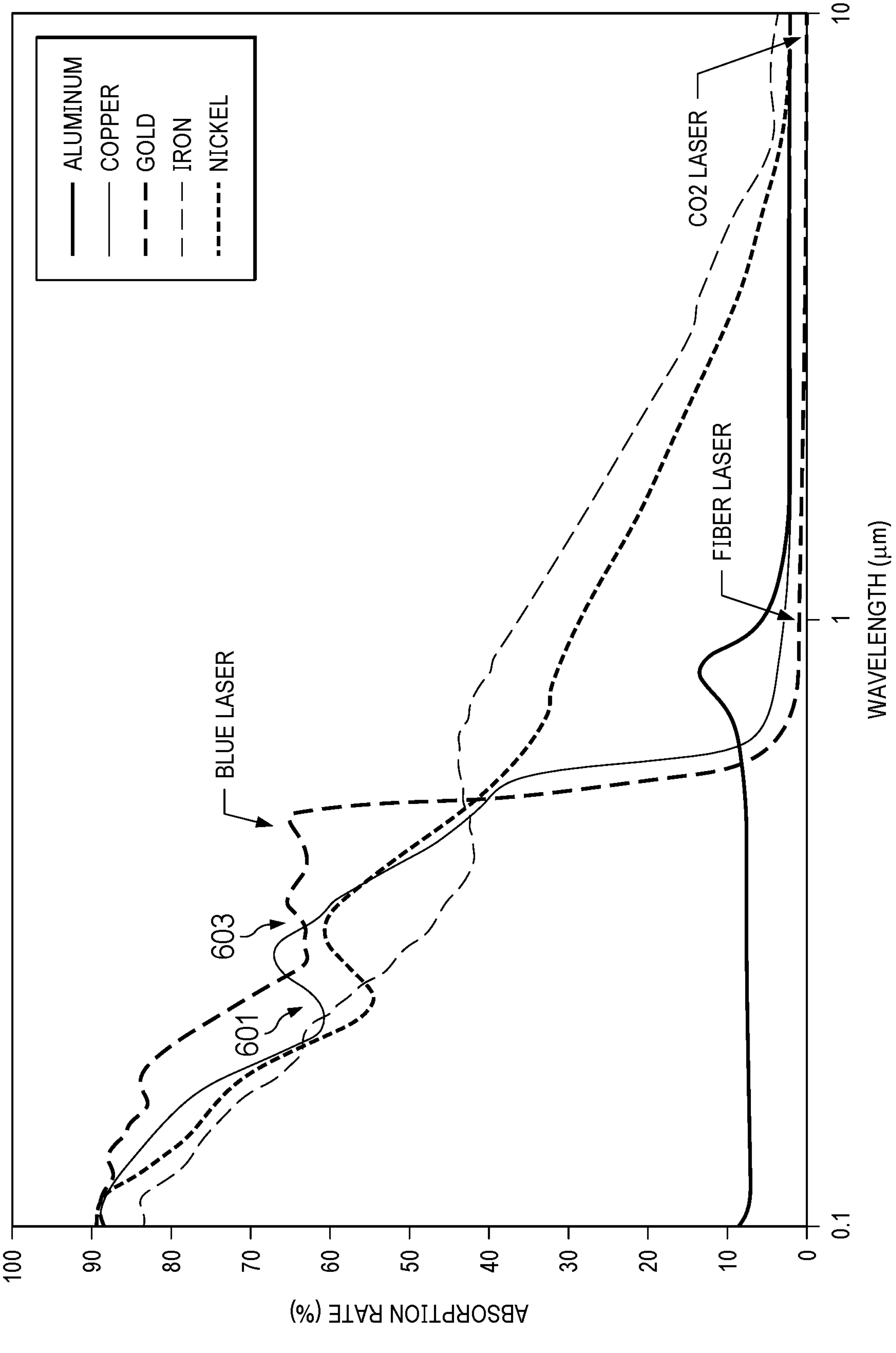
FIG. 6 illustrates, in a graph, the absorption of laser energy by materials that can be used with the arrangements.

FIG. 6 illustrates, in an X-Y graph, the absorption of laser energy of differing wavelengths by metal materials used in semiconductor processes. As shown in FIG. 6, for lasers of between 200 and 500 nanometers (0.3-0.5 microns) wavelength, copper and gold both have good absorption of about 60 percent. The curve 601 is for copper, and curve 603 is for gold.

Lasers in the ultraviolet (wavelengths between 200-389 nanometers), violet (wavelengths between 390 nanometers and 419 nanometers, and blue (wavelengths between 420 nanometers and 499 nanometers) are well absorbed by copper and gold. Blue lasers of 445 nanometer wavelength have been shown to exhibit good heating and absorption by copper in particular, and are readily commercially available. Use of these commercially available lasers in the arrangements provides an economical method to implement a wire bonding tool enhanced with laser energy.

Figure 7:
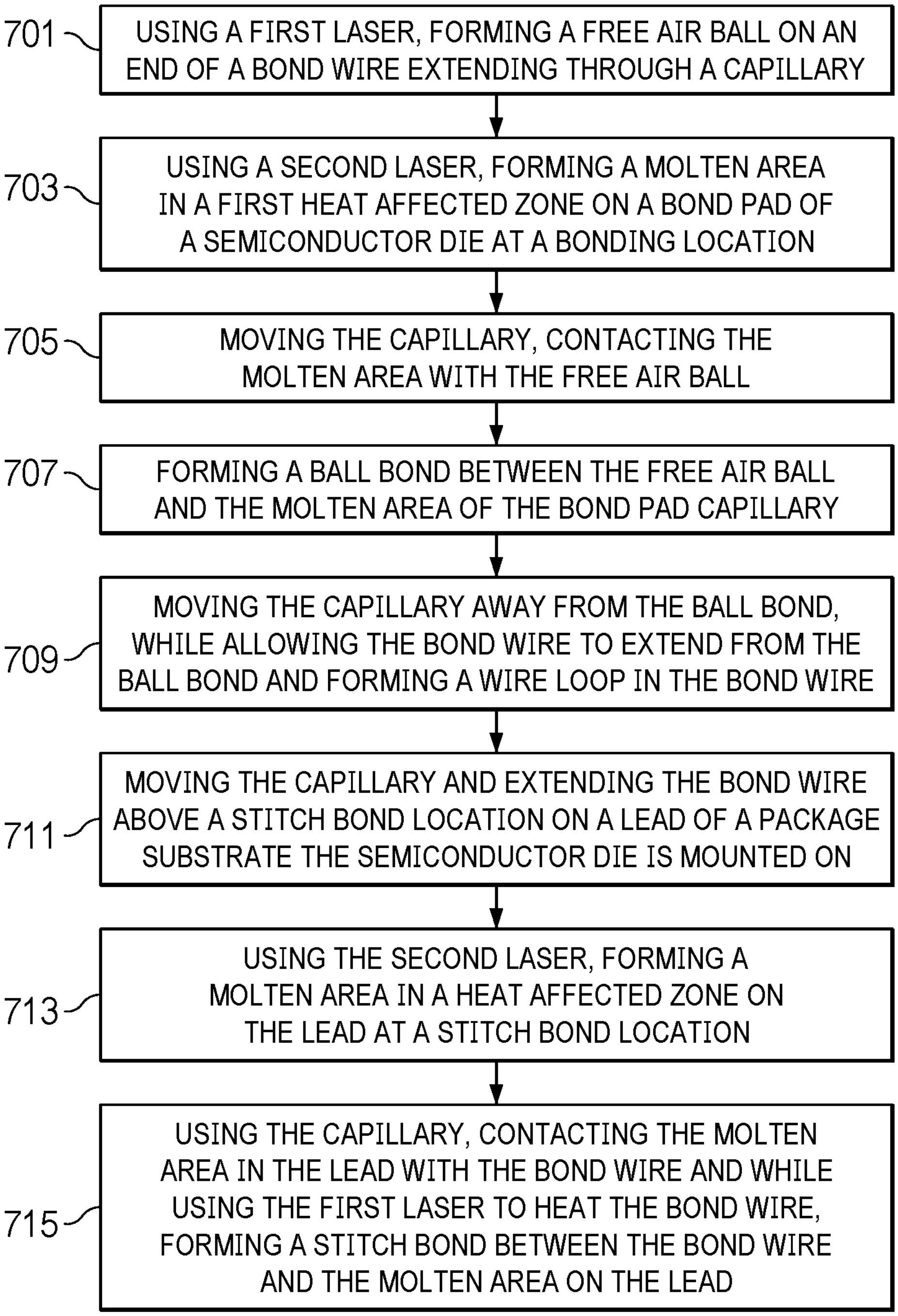
FIG. 7 illustrates, in a flow diagram, a method for forming a bond wire connection using an example laser enhanced wire bonding arrangement.

FIG. 7 illustrates, in a flow diagram, steps for forming an arrangement corresponding to the steps shown in the series of illustrations of FIGS. 5A-5H. At step 701, the method begins by using a first laser, forming a free air ball of molten material on an end of a bond wire extending through a capillary. (See, for example, the free air ball 565 in FIG. 5C). The free air ball can be formed using a laser beam from a first laser source, as described above and shown in FIG. 5C. In an alternative approach, an EFO system can be used to form the free air ball.

At step 703, the method continues by using a second laser, forming a molten area on a bond pad of a semiconductor die at a bonding location. (See the molten area in the heat affected zone 567 on bond pad 508 in FIG. 5C). As shown in FIG. 5C, forming the free air ball and forming the molten area can be performed simultaneously, alternatively these steps can be performed contemporaneously in any order.

The method then continues at step 705, by moving the capillary and contacting the molten area with the free air ball. At step 707, the method continues by forming a ball bond between the free air ball and the molten area of the bond pad. (See FIG. 5C where the capillary 551 carries the free air ball 565 to contact molten area of the heat affected zone 567, and FIG. 5D where the ball bond 570 is shown on bond pad 508).

At step 709, the method continues by moving the capillary away from the ball bond, while allowing the bond wire to extend from the ball bond and forming a wire bond loop in the bond wire extending from the ball bond. (See FIG. 5D where the capillary 551 moves away from the ball bond 570, with bond wire 553 extending from the ball bond, and FIG. 5E where the wire bond 519 is shown forming a loop extending from the ball bond 570.)

At step 711 the method continues by moving the capillary and extending the bond wire above a stitch bond location on a lead of a package substrate the semiconductor die is mounted on. (See, for example, FIG. 5E where the capillary 551 is positioned over the lead 515 of the leadframe 537, while the semiconductor die 505 is mounted on the die pad 513 of the leadframe 537).

At step 713, the method continues by using the second laser beam, forming a molten area on the lead at a stitch bond location. (See, for example, FIG. 5F, where the second laser beam is shown forming molten portion in heat affected zone 572 on the lead 515 at a stitch bond location).

At step 715, the method continues by using the capillary, contacting the molten area on the lead with the bond wire and while using the first laser to heat the bond wire, forming a stitch bond between the bond wire and the molten area on the lead. (See FIG. 5G, where the stitch bond is formed by placing the bond wire 553 onto the molten portion in heat affected zone 572 on the lead 515; and FIG. 5H where the stitch bond 574 is shown).

The steps 701, 703, 705, 707, 709, 711, 713 and 715 shown in FIG. 7 can be repeatedly performed in an automated wire bonder until all of the wire bond connections between the bond pads on the semiconductor die and the leads of the leadframe are completed. The use of the laser enhanced wire bonding of the arrangements results in metal-to-metal bonds at the ball bonds on the bond pads and at stitch bonds on the leads, without the need for ultrasonic energy and without the use of a heater block, resulting in improved bonds, less damage to the bond pads, and lower costs for the wire bonder tool.

Modifications are possible in the described arrangements, and other alternative arrangements are possible within the scope of the claims.

What is claimed is:

1. A method, comprising:

using a first laser, forming a free air ball of molten material on an end of a bond wire extending through a capillary;

using a second laser, forming a molten area on a bond pad of semiconductor die at a bonding location;

moving the capillary and contacting the molten area with the free air ball;

forming a ball bond between the free air ball and the molten area of the bond pad;

moving the capillary away from the ball bond, while allowing the bond wire to extend from the ball bond and forming a wire bond loop in the bond wire extending from the ball bond;

moving the capillary and extending the bond wire above a stitch bond location on a lead of a package substrate the semiconductor die is mounted on;

using the second laser, forming a molten area in a heat affected zone on the lead at the stitch bond location; and using the capillary, contacting the molten area in the heat affected zone on the lead with the bond wire and while using the first laser to heat the bond wire, forming a stitch bond between the bond wire and the molten area on the lead, wherein the first laser and the second laser are attached to the capillary.

2. The method of claim 1, wherein forming the stitch bond comprises forming a copper-to-copper bond between a copper lead and a copper bond wire.

3. The method of claim 1, wherein the first laser and the and second laser have a wavelength between 300 nanometers and 499 nanometers.

4. The method of claim 1, wherein the first laser is a blue laser with a wavelength of about 445 nanometers.

5. The method of claim 1, wherein the bond wire is copper, palladium coated copper, gold, silver or aluminum.

6. The method of claim 1, wherein the bond wire comprises copper or an alloy of copper, and the bond pad comprises copper or an alloy of copper, and the lead comprises copper or an alloy of copper.

7. The method of claim 1, wherein the bond wire is copper and the bond pad is copper, the ball bond is a copper-to-copper bond, and the lead is a copper or copper alloy, and the stitch bond is a copper-to-copper bond.

8. The method of claim 1, wherein during the formation of the ball bond, the semiconductor die is at a temperature between 15-degrees C. and 40-degrees C.

9. The method of claim 1, wherein using the first laser to form the free air ball and using the second laser to form the molten portion of the bond pad are performed simultaneously.

10. The method of claim 1, wherein using the second laser to form a molten area on a lead, and using the first laser to heat the bond wire while forming a stitch bond, are performed simultaneously.

11. The method of claim 1, wherein the bond wire is gold or gold alloy.

12. The method of claim 11, wherein the bond pad is gold or gold alloy, and the ball bond is a gold-to-gold bond.

13. The method of claim 1, wherein forming the ball bond and forming the stitch bond are performed without applying ultrasonic energy to the capillary.

14. The method of claim 1, wherein using a second laser, forming a molten area on a bond pad of semiconductor die at a bonding location comprises forming a first heat affected zone in the molten area of a diameter of less than 100 microns.

15. The method of claim 1, wherein using the using the second laser, forming a molten area on the lead at a stitch bond location comprises forming a second heat affected zone in the molten area one the lead of a diameter of less than 100 microns.

* * * * *